(12) United States Patent
Lee et al.

(10) Patent No.: US 10,957,698 B2
(45) Date of Patent: Mar. 23, 2021

(54) REDUCTION OF MULTI-THRESHOLD VOLTAGE PATTERNING DAMAGE IN NANOSHEET DEVICE STRUCTURE

(71) Applicant: International Business Machines Corporation, Armonk, NY (US)

(72) Inventors: ChoongHyun Lee, Rensselaer, NY (US); Kangguo Cheng, Schenectady, NY (US); Juntao Li, Cohoes, NY (US); Shogo Mochizuki, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/599,766

(22) Filed: Oct. 11, 2019

(65) Prior Publication Data
US 2020/0091149 A1 Mar. 19, 2020

Related U.S. Application Data

(62) Division of application No. 16/133,030, filed on Sep. 17, 2018, now Pat. No. 10,559,566.

(51) Int. Cl.
| | | |
|---|---|---|
| H01L 27/092 | (2006.01) | |
| H01L 29/66 | (2006.01) | |
| H01L 29/06 | (2006.01) | |
| H01L 21/28 | (2006.01) | |
| H01L 21/8238 | (2006.01) | |
| H01L 21/3065 | (2006.01) | |
| H01L 21/02 | (2006.01) | |
| H01L 29/49 | (2006.01) | |

(52) U.S. Cl.
CPC ...... *H01L 27/092* (2013.01); *H01L 21/02603* (2013.01); *H01L 21/28088* (2013.01);
(Continued)

(58) Field of Classification Search
CPC ............ H01L 27/092; H01L 21/28088; H01L 21/02603; H01L 21/3065;
(Continued)

(56) References Cited

U.S. PATENT DOCUMENTS

| 7,427,788 B2 | 9/2008 | Li et al. |
|---|---|---|
| 9,287,357 B2 | 3/2016 | Rodder et al. |

(Continued)

OTHER PUBLICATIONS

M. Schmidt et al., "Mobility extraction in SOI MOSFETs with sub 1 nm body thickness", Solid State Electronics, 2009, pp. 1246-1251, vol. 53.

(Continued)

*Primary Examiner* — Shahed Ahmed
(74) *Attorney, Agent, or Firm* — Abdy Raissinia; Ryan, Mason & Lewis, LLP

(57) ABSTRACT

Devices and methods are provided to fabricate nanosheet field-effect transistor devices having dummy nanosheet channel layers disposed above active nanosheet channel layers to protect the active nanosheet channel layers from oxidation during work function metal patterning processes that are implemented as part of a multi-threshold voltage process module. The dummy nanosheet channel layers have a reduced thickness so that the dummy nanosheet layers do not function as active channel layers of the nanosheet field-effect transistor devices. The dummy nanosheet channel layers serve as oxygen infusion blocking layers to protect the active nanosheet channel layers from being infused with oxygen and oxidized by a directional plasma etch process performed during a work function metal patterning process.

20 Claims, 20 Drawing Sheets

(52) U.S. Cl.
CPC .. *H01L 21/3065* (2013.01); *H01L 21/823807* (2013.01); *H01L 21/823828* (2013.01); *H01L 29/0673* (2013.01); *H01L 29/4966* (2013.01); *H01L 29/66545* (2013.01)

(58) Field of Classification Search
CPC ..... H01L 21/823807; H01L 21/823828; H01L 29/0673; H01L 29/4966; H01L 29/66545; H01L 29/0665; H01L 29/78687; H01L 29/0669–068; H01L 29/7853–2029/7858; H01L 29/78696; H01L 29/66439; H01L 29/66469
See application file for complete search history.

(56) References Cited

U.S. PATENT DOCUMENTS

| | | | |
|---|---|---|---|
| 9,502,518 B2 | 11/2016 | Liu et al. | |
| 9,620,590 B1 | 4/2017 | Bergendahl et al. | |
| 9,761,722 B1 | 9/2017 | Jagannathan et al. | |
| 9,812,449 B2 | 11/2017 | Obradovic et al. | |
| 9,947,743 B2 | 4/2018 | Doris et al. | |
| 2011/0183133 A1* | 7/2011 | Osada | C01G 23/005 428/220 |
| 2017/0221992 A1 | 8/2017 | Chang et al. | |
| 2017/0256609 A1* | 9/2017 | Bhuwalka | H01L 29/0665 |
| 2018/0053837 A1* | 2/2018 | Bi | H01L 21/02236 |
| 2018/0083113 A1 | 3/2018 | Balakrishnan et al. | |
| 2018/0122899 A1* | 5/2018 | Guillorn | H01L 21/28017 |
| 2018/0166534 A1* | 6/2018 | Tao | H01L 29/78696 |
| 2018/0301341 A1* | 10/2018 | Coquand | H01L 29/66742 |
| 2020/0083352 A1* | 3/2020 | Chanemougame | H01L 29/0673 |

OTHER PUBLICATIONS

List of IBM Patents or Patent Applications Treated as Related.

* cited by examiner

10

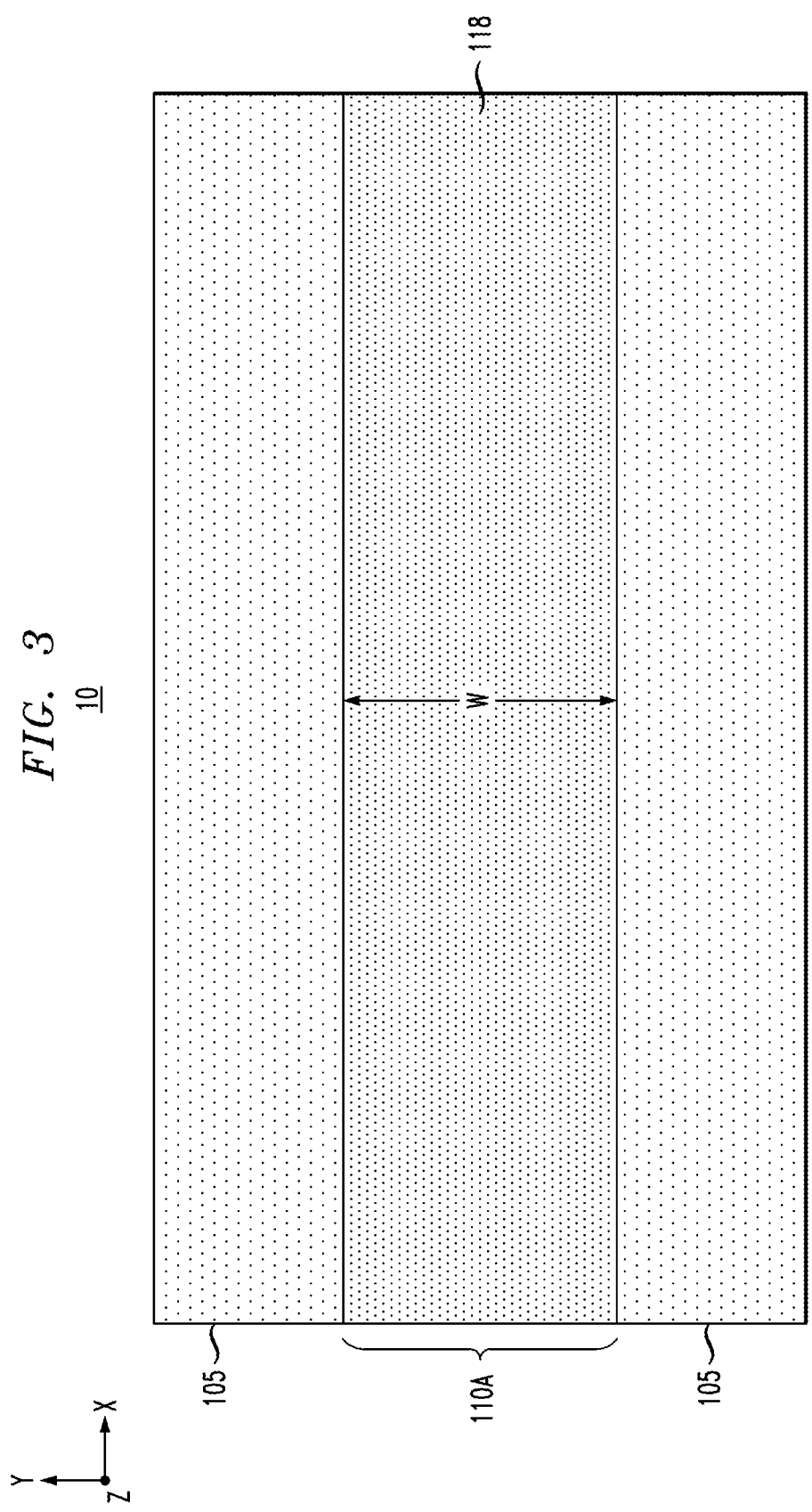

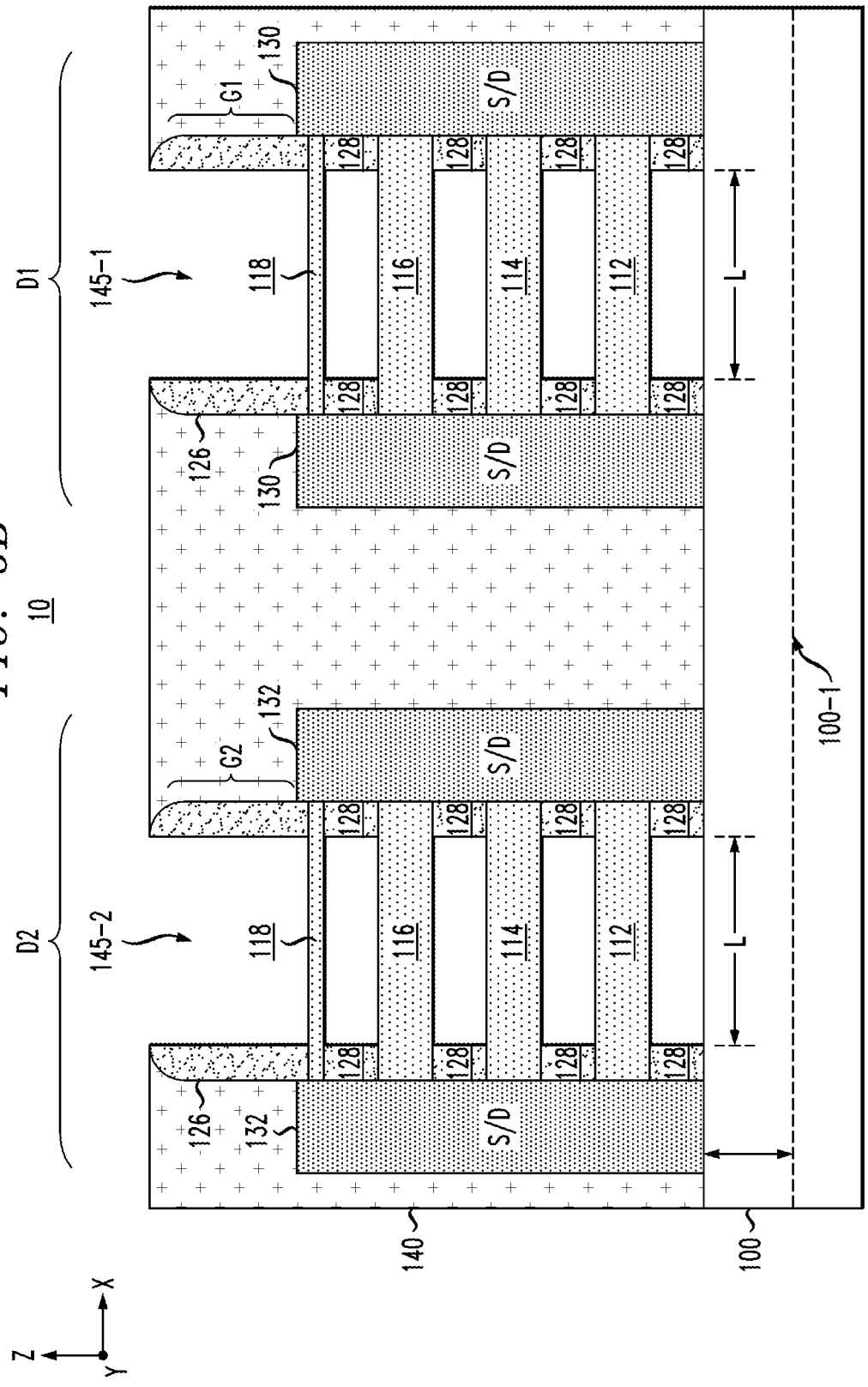

20

REDUCTION OF MULTI-THRESHOLD VOLTAGE PATTERNING DAMAGE IN NANOSHEET DEVICE STRUCTURE

TECHNICAL FIELD

This disclosure relates generally to semiconductor fabrication techniques and, in particular, to structures and methods for fabricating non-planar field-effect transistor (FET) devices such as nanosheet FET devices.

BACKGROUND

Continued innovations in semiconductor process technologies are enabling higher integration densities and device scaling. As the semiconductor industry moves towards the 7-nm technology node and beyond, semiconductor FET device structures must be scaled to smaller dimensions to provide increased device width per footprint area. In this regard, non-planar FET devices such as nanosheet FET devices, nanowire FET devices, vertical FET devices, Fin-FET devices, etc., are a viable option for continued CMOS scaling. In general, a nanowire FET device comprises a device channel which comprises one or more nanowire layers in a stacked configuration, wherein each nanowire comprises an elongated semiconductor layer that has a width which is substantially the same or slightly larger than a thickness of the elongated semiconductor layer. A nanosheet FET device is similar to a nanowire FET device sheet in that a device channel comprises one or more nanosheet layers in a stacked configuration, but wherein each nanosheet layer has a width which is substantially greater than a thickness of the nanosheet layer. In nanowire/nanosheet FET devices, a common gate structure is formed above and below each nanowire/nanosheet layer in the stacked configuration, thereby increasing the FET device width (or channel width), and thus the drive current, for a given footprint area.

The threshold voltage (Vt) of a FET device is the voltage that is required to turn the transistor on. Multi-threshold voltage CMOS (MTCMOS) technologies implement methods for fabricating FET devices with multiple threshold voltages in order to optimize device performance (delay, power, etc.) for different applications. The threshold voltage of a FET device can be tuned using various techniques. For example, the threshold voltage of an FET device varies with gate dielectric thickness, wherein the threshold voltage decreases as the thickness of gate dielectric layer decreases. In addition, multi-Vt fabrication methods can tune the threshold voltages of non-planar FET devices by changing the thickness and/or material composition of work function metal (WFM) layers that are formed as part of high-k gate dielectric/metal gate (HKMG) structures for the non-planar FET devices such as nanosheet FET devices. The material composition of the work function metal layers can be modified through dopant implantation, or by forming multilayer WFM structures comprising stacks of two or more different types of work function metal layers.

The HKMG structures for p-type FET devices and n-type FET devices are typically formed with different WFM layers (one for p-FETs and one for n-FETs) as a way to optimize or otherwise tune the threshold voltages of the n-FETs and p-FETs, without the need for channel doping to achieve Vt tuning. In addition, the threshold voltages of n-type FET devices in different device regions can be tuned by using different metallic composition and/or layers for work function metal layers for the n-type FET devices. Similarly, the threshold voltages of p-type FET devices in different device regions can be tuned by using different metallic composition and/or layers for work function metal layers for the p-type FET devices. In this regard, WFM patterning methods are widely used in the semiconductor industry to fabricate FET devices with different work function metal layers so as to realize FET devices with multiple threshold voltages. However, the WFM patterning process can result in the formation of interfacial oxide layers (or increase the thickness of existing interfacial oxide layers) on active silicon channel layer of the FET devices as a result of etching environments used for the WFM patterning. The unwanted growth (or regrowth) of interfacial oxide layers on silicon channel layers of FET devices results in non-uniformity of the channel layers of the FET devices, as well as degraded device performance.

SUMMARY

Embodiments of the invention include methods for fabricating semiconductor integrated circuit devices comprising nanosheet field-effect transistor devices having dummy nanosheet channel layers disposed above active nanosheet channel layers to protect the active nanosheet channel layers from oxidation during a work function metal patterning process, as well semiconductor integrated circuit devices comprising nanosheet field-effect transistor devices having protective dummy nanosheet channel layers.

For example, one embodiment includes a method for fabricating a semiconductor device, which comprises: forming a nanosheet field-effect transistor device on a semiconductor substrate, wherein the nanosheet field-effect transistor device comprises: (i) a nanosheet stack structure comprising an active nanosheet channel layer and a dummy nanosheet channel layer disposed above the active nanosheet channel layer; (ii) a gate structure formed over the nanosheet stack structure, wherein the gate structure comprises a gate sidewall spacer which defines a gate region, conformal gate dielectric layers formed on surfaces of the active nanosheet channel layer and the dummy nanosheet channel layer within the gate region, and a first layer of work function metal formed on the conformal gate dielectric layers and filling the gate region including spaces above and below the active nanosheet channel layers and the dummy nanosheet channel layer with the work function metal; performing a work function metal patterning process to remove the first layer of work function metal from the gate region, wherein the dummy nanosheet channel layer serves as an oxygen infusion blocking layer to protect the active nanosheet channel layer from being infused with oxygen and oxidized by a directional plasma etch process performed during the work function metal patterning process; and filling the gate region with a second layer of work function metal which is different from the first layer of work function metal.

Another embodiment includes a method for fabricating a semiconductor device, which comprises: forming a nanosheet stack structure on a semiconductor substrate, wherein the nanosheet stack structure comprises a stack of alternating semiconductor layers which comprises sacrificial nanosheet layers, active nanosheet channel layers, and a dummy nanosheet channel layer, wherein each active nanosheet channel layer is disposed between sacrificial nanosheet layers in the nanosheet stack structure, and wherein the dummy nanosheet channel layer is formed on an upper sacrificial nanosheet layer of the nanosheet stack structure; forming a dummy gate over the nanosheet stack structure to define a gate region; forming a gate sidewall spacer surrounding the dummy gate; removing the dummy gate to open the gate region and expose a portion of the nanosheet stack structure surrounded by the gate sidewall spacer; removing the sacrificial nanosheet layers exposed in the gate region to release the active nanosheet channel layers and form spaces above and below the active nanosheet channel layers; forming conformal gate dielectric layers on exposed surfaces of the dummy nanosheet channel layer and the active nanosheet channel layers within the gate region; filling the gate region with a first layer of work function metal, wherein the first layer of work function metal fills the spaces above and below the active nanosheet channel layers; performing a work function metal patterning process to remove the first layer of work function metal from the gate region, wherein the dummy nanosheet channel layer serves as an oxygen infusion blocking layer to protect the active nanosheet channel layers from being infused with oxygen and oxidized by a directional plasma etch process performed during the work function metal patterning process; and filling the gate region with a second layer of work function metal which is different from the first layer of work function metal.

Another embodiment includes a semiconductor integrated circuit device, which comprises a nanosheet field-effect transistor device disposed on a semiconductor substrate. The nanosheet field-effect transistor device comprises: a nanosheet stack structure comprising a plurality of active nanosheet channel layers and a dummy nanosheet channel layer disposed above the active nanosheet channel layers of the nanosheet stack structure; and a metal gate structure covering the nanosheet stack structure. The metal gate structure comprises: conformal gate dielectric layers disposed on surfaces of the dummy nanosheet channel layer and the active nanosheet channel layers; and a layer of work function metal formed on the gate dielectric layers and filling the gate region including spaces above and below the active nanosheet channel layers and the dummy nanosheet channel layer with the work function metal. The dummy nanosheet channel layer has a thickness which is less than a thickness of each of the active nanosheet channel layers, wherein the thickness of the dummy nanosheet channel layer is configured so that the dummy nanosheet channel layer does not function as an active channel layer of the nanosheet field-effect transistor device. The dummy nanosheet channel layer serves as an oxygen infusion blocking layer to protect the active nanosheet channel layers from being infused with oxygen and oxidized by a directional plasma etch process performed during a work function metal patterning process to remove a previous layer of work function metal disposed in the gate region.

Other embodiments will be described in the following detailed description of embodiments, which is to be read in conjunction with the accompanying figures.

BRIEF DESCRIPTION OF THE DRAWINGS

FIGS. 2-10B schematically illustrate a method for fabricating the semiconductor integrated circuit device of FIGS. 1A and 1B, according to an embodiment of the invention wherein:

FIG. 2 is a schematic cross-sectional side view of the semiconductor device structure at an initial stage of fabrication comprising a semiconductor substrate and a nanosheet stack structure formed on the semiconductor substrate, wherein the nanosheet stack structure comprises a stack of alternating sacrificial nanosheet layers and active nanosheet channel layers, and a dummy nanosheet channel layer formed on an upper sacrificial nanosheet layer of the nanosheet stack structure;

FIG. 3 is a schematic top plan view of the semiconductor device structure of FIG. 2 after patterning the nanosheet stack structure to form an elongated nanosheet stack structure with a defined width W, and after forming a shallow trench isolation (STI) layer in the semiconductor substrate surrounding the elongated nanosheet stack structure;

FIG. 5 is a schematic cross-sectional side view of the semiconductor device structure shown in FIG. 4B after forming inner spacers for the first and second gate structures, forming epitaxial source/drain layers for the first and second nanosheet FET devices, and after forming an interlayer dielectric layer;

FIG. 6B is a schematic cross-sectional side view of the semiconductor device structure of FIG. 6A along line 6B-6B shown in FIG. 6A;

FIG. 7 is a schematic cross-sectional side view of the semiconductor device structure shown in FIG. 6B after forming interfacial oxide layers on exposed silicon surfaces of the active nanosheet channel layers and the dummy nanosheet channel layers within the first and second open gate regions of the first and second gate structures;

FIG. 9 is a schematic cross-sectional side view of the semiconductor device structure shown in FIG. 8A after forming an etch mask on the ILD layer, wherein the etch mask comprises an opening that exposes the gate region of the second nanosheet FET device while covering the gate region of the first nanosheet device, and after removing the first layer of work function metal from the gate region of the second nanosheet FET device;

FIG. 10B is a schematic cross-sectional side view of the semiconductor device structure of FIG. 10A along line 10B-10B shown in FIG. 10A.

FIGS. 11-13 schematically illustrate a method for fabrication a semiconductor integrated circuit device comprising first and second nanosheet FET devices having dummy nanosheet channel layers disposed above active nanosheet channel layers to protect the active nanosheet channel layers from oxidation during a work function metal patterning process, according to another embodiment of the invention wherein:

FIG. 11 is a schematic cross-sectional side view of the semiconductor structure of FIG. 6B after performing a silicon thinning process to decrease a thickness of the exposed portions of the dummy nanosheet channel layers and the active nanosheet channel layers with the first and second open gate regions of the first and second gate structures;

FIG. 12 is a schematic cross-sectional side view of the semiconductor device of FIG. 11 after forming thin interfacial oxide layers on the exposed, thinned silicon surfaces of the active nanosheet channel layers within the first and second open gate regions, and converting the thinned portion of the dummy nanosheet channel layer to a dummy oxide nanosheet layer; and FIG. 13 is a schematic cross-sectional side view of the semiconductor device of FIG. 12 after forming high-k gate dielectric and work function metal gate structures within the first and second open gate regions of the first and second gate structures of the first and second nanosheet FET devices. D1 and D2.

DETAILED DESCRIPTION

Figure 1A:
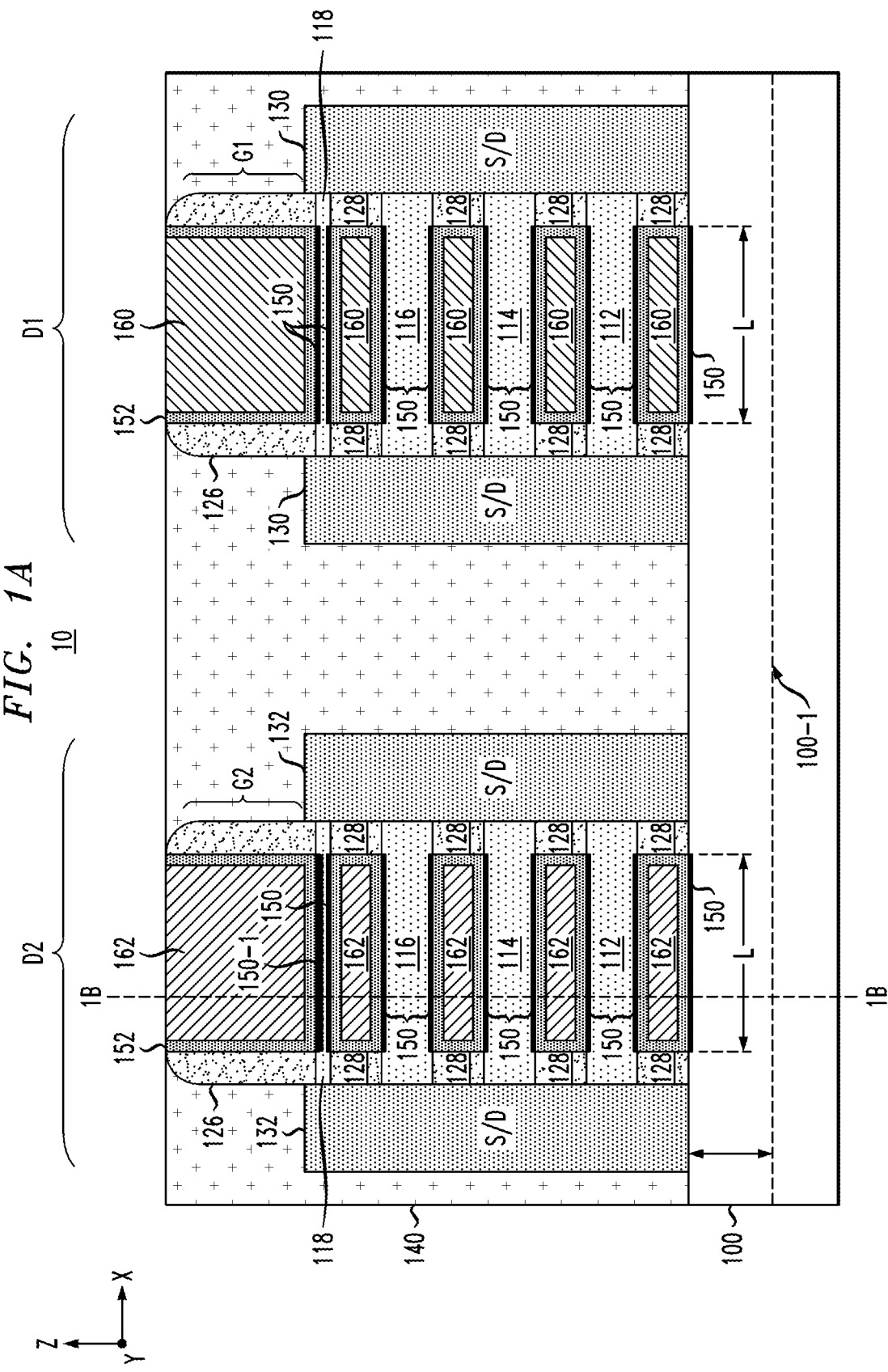
FIG. 1A is a schematic cross-sectional side view of a semiconductor integrated circuit device comprising first and second nanosheet FET devices having dummy nanosheet channel layers disposed above active nanosheet channel layers to protect the active nanosheet channel layers from oxidation during a work function metal patterning process, according to an embodiment of the invention.

Embodiments of the invention will now be described in further detail with regard Devices and methods are provided to fabricate nanosheet field-effect transistor devices having dummy nanosheet channel layers disposed above active nanosheet channel layers to protect the active nanosheet channel layers from oxidation during work function metal patterning processes that are implemented as part of a multi-threshold voltage process module. The dummy nanosheet channel layers have a reduced thickness so that the dummy nanosheet layers do not function as active channel layers of the nanosheet field-effect transistor devices. The dummy nanosheet channel layers serve as an oxygen infusion blocking layers to protect the active nanosheet channel layers from being infused with oxygen and oxidized by a directional plasma etch process performed during a work function metal patterning process.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor device structures. Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error is present, such as 1% or less than the stated amount.

To provide spatial context to the different structural orientations of the semiconductor device structures shown throughout the drawings, XYZ Cartesian coordinates are shown in each of the drawings. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

Figure 1B:
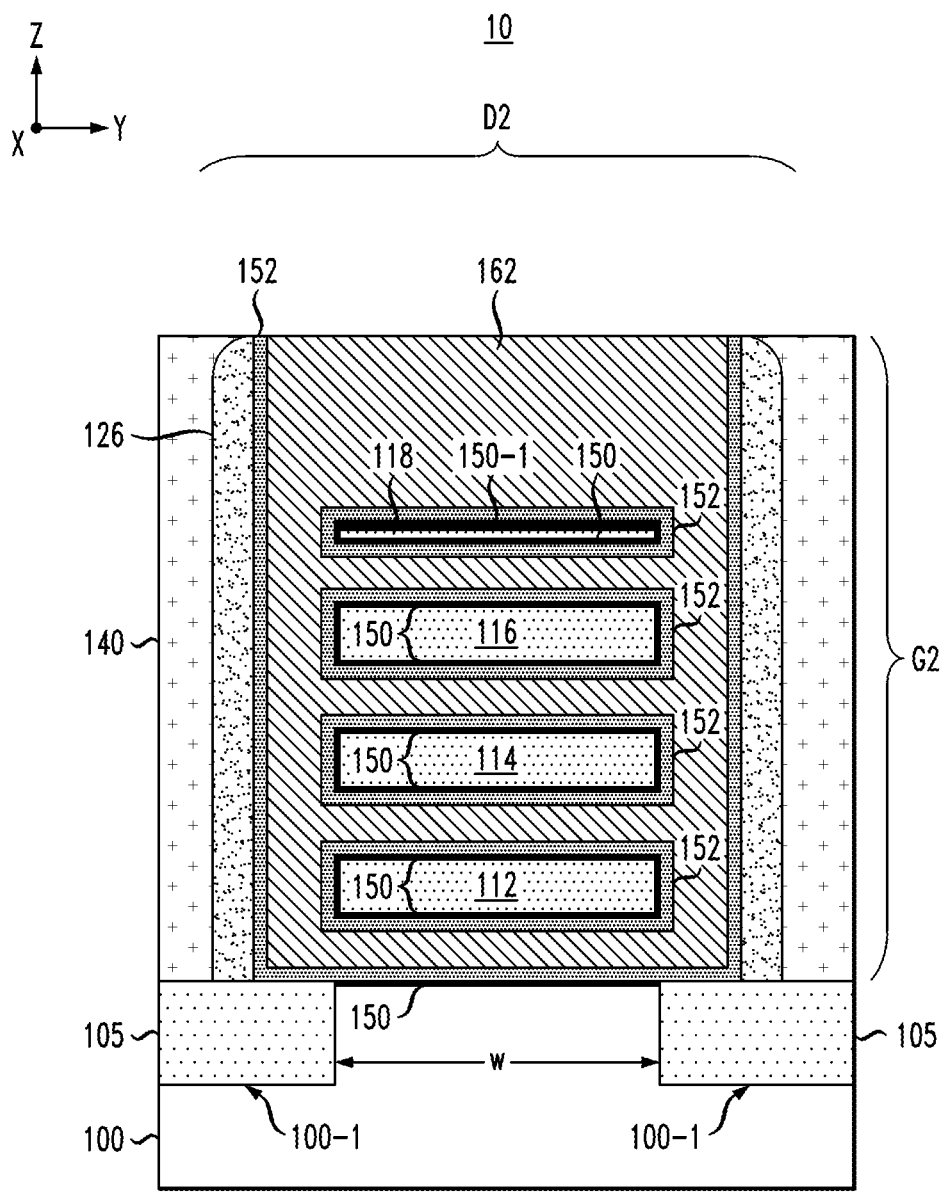
FIG. 1B is a schematic cross-sectional side view of the semiconductor integrated circuit device of FIG. 1A along line 1B-1B shown in FIG. 1A.

FIGS. 1A and 1B are schematic views of a semiconductor integrated circuit device 10 comprising a first nanosheet FET device D1 and a second nanosheet FET D2 having dummy nanosheet channel layers disposed above active nanosheet channel layers to protect the active nanosheet channel layers from oxidation during a work function metal patterning process. FIG. 1A is a schematic cross-sectional side view (X-Z plane) of the semiconductor integrated circuit device 10, and FIG. 1B is a schematic cross-sectional side view (Y-Z plane) of the semiconductor integrated circuit device 10 along line 1B-1B in FIG. 1A. As illustrated in FIGS. 1A and 1B, the semiconductor integrated circuit device 10 comprises a semiconductor substrate 100, a shallow trench isolation layer 105 disposed within a trench 100-1 formed in semiconductor substrate 100.

The first and second nanosheet FET devices D1 and D2 each comprise a nanosheet stack structure comprising a plurality of active nanosheet channel layers 112, 114, and 116, and a dummy nanosheet channel layer 118 disposed above the active nanosheet channel layers 112, 114, and 116. In one embodiment, the active nanosheet channel layers 112, 114, and 116, and the dummy nanosheet channel layer 118 are formed of epitaxial semiconductor material such as epitaxial silicon. The first and second nanosheet FET devices D1 and D2 comprise respective first and second gate structures G1 and G2 covering the respective nanosheet stack structures. The first and second gate structures G1 and G2 each comprise a gate sidewall spacer 126 and inner sidewall spacers 128 which define gate regions of the gate structures G1 and G2, wherein high-k gate dielectric/metal gate (HKMG) structures are formed within the gate regions defined by the sidewall spacers 126 and 128 of the gate structures G1 and G2.

The first nanosheet FET device D1 comprises epitaxial source/drain layers 130 which are connected to end portions of the active nanosheet channel layers 112, 114, 116 and the dummy nanosheet channel layer 118, along a channel length L of the nanosheet FET device D1 (wherein the channel length L is defined by the distance between the inner surfaces of the inner sidewall spacers 128, as schematically illustrated in FIG. 1A). In one embodiment, the source/drain layers 130 comprise merged epitaxial semiconductor layers that are epitaxially grown on the end portions of the end portions of the active nanosheet channel layers 112, 114, 116 and the dummy nanosheet channel layer 118. Similarly, the second nanosheet FET device D2 comprises epitaxial source/drain layers 132 which are connected to end portions of the active nanosheet channel layers 112, 114, 116 and the dummy nanosheet channel layer 118, along a channel length L of the nanosheet FET device D2. In one embodiment, the source/drain layers 132 comprise merged epitaxial semiconductor layers that are epitaxially grown on the end portions of the end portions of the active nanosheet channel layers 112, 114, 116 and the dummy nanosheet channel layer 118. It is to be understood that the term "source/drain region" as used herein means that a given source/drain region can be either a source region or a drain region, depending on the application or circuit configuration. The nanosheet FET devices D1 and D2 are encapsulated in an insulating layer 140 (e.g., an interlayer dielectric (ILD) layer or a PMD (pre-metal dielectric) layer) which is formed as part of a middle-of-the-line (MOL) layer of the semiconductor integrated circuit device 10.

In the exemplary embodiment shown in FIGS. 1A and 1B, the HKMG structure of the first gate structure G1 comprises (i) thin interfacial silicon oxide layers 150 formed on the epitaxial silicon surfaces of the active nanosheet channel layers 112, 114, and 116, the dummy nanosheet channel layer 118, and on a portion of the semiconductor substrate 100 exposed within the gate region of the gate structure G1, (ii) conformal layers of high-k gate dielectric material 152 disposed on the interfacial silicon oxide layers 150, and (ii) a first layer of work function metal 160 which fills the gate region including the spaces above and below the active nanosheet channel layers 112, 114, and 116 and the dummy nanosheet channel layer 118 with the work function metal. Similarly, the HKMG structure of the second gate structure G2 comprises (i) thin interfacial silicon oxide layers 150 formed on the epitaxial silicon surfaces of the active nanosheet channel layers 112, 114, and 116, the dummy nanosheet channel layer 118, and on a portion of the semiconductor substrate 100 exposed within the gate region of the gate structure G2, (ii) conformal layers of high-k gate dielectric material 152 disposed on the interfacial silicon oxide layers 150, and (ii) a second layer of work function metal 162 which fills the gate region including the spaces above and below the active nanosheet channel layers 112, 114, and 116 and the dummy nanosheet channel layer 118 with the work function metal.

In the exemplary embodiment of FIGS. 1A and 1B, it is assumed that the first and second nanosheet FET devices D1 and D2 are designed to have different threshold voltages (Vt) which are tuned to different target values by utilizing different metallic compositions and/or layers of work function metal for the first and second layers of work function metal 160 and 162. For example, the first layer of work function metal 160 may comprise titanium nitride (TiN) and the second layer of work function metal 161 may comprise titanium aluminum carbide (TiAlC) (or a multilayer WFM stack comprising, e.g., a thin layer of TiAlC disposed between thin TiN layers.

To fabricate the nanosheet FET devices D1 and D2 with the different layers of work function metal 160 and 162, the HKMG structures of the nanosheet FET devices D1 and D2 are initially fabricated with the same layer of work function metal (e.g., the first layer of work function metal 160), and a WFM patterning method is performed, for example, to remove the first layer of work function metal 160 from the gate structure G2 of the second nanosheet FET device D2 and refill the gate region with the second layer of work function metal 162, resulting in the first and second nanosheet FET devices D1 and D2 having different threshold voltages due to the different layers of work function metal 160 and 162.

As noted above, in the absence of the dummy nanosheet channel layers 118, the WFM patterning process can result in the formation of interfacial oxide layers (or increase the thickness of the existing interfacial oxide layers 150) in the silicon material of the upper active nanosheet channel layer 116 as a result of oxidation of the silicon material due to one or more directional plasma etch processes that are performed during the WFM patterning process. The unwanted growth (or regrowth) of interfacial oxide layers on the active nanosheet channel layers (e.g., upper layer 116) of the nanosheet FET devices D1 and D2 devices would result in non-uniformity in the structure and operation of the active channel layers and the HKMG structures, leading to degraded device performance.

In the exemplary embodiment of FIGS. 1A and 1B, the dummy nanosheet channel layers 118 serve as an oxygen infusion blocking layer to protect the underlying active nanosheet channel layers 116 from being infused with oxygen and oxidized by the directional plasma etch processes that are performed during the WFM patterning process to remove, e.g., the first layer of work function metal 160 disposed within the gate region of the second gate structure G2. For example, as shown in FIGS. 1A and 1B, an upper portion of the dummy nanosheet channel layer 118 within the gate region of the second gate structure G2 comprises an interfacial silicon oxide layer 150-1 which is either grown, or regrown with increased thickness (as compared to the initially formed interfacial oxide layers 150) due to further oxidation of the silicon material of the dummy nanosheet channel layer 118 as a result of the directional plasma etch processes that are performed during the WFM patterning process to remove the first layer of work function metal 160 from the gate region of the second gate structure G2.

The dummy nanosheet channel layers 118 are formed with a thickness which is less than a thickness of each of the active nanosheet channel layers 112, 114 and 116, where the thickness of the dummy nanosheet channel layers 118 is configured so that the dummy nanosheet channel layers 118 do not function as active channel layers of the nanosheet FET devices D1 and D2. Instead, as noted above, the dummy nanosheet channel layers 118 only serves as an oxygen infusion blocking layer to protect the underlying active nanosheet channel layers 116 from being infused with oxygen and oxidized during the WFM patterning process. In this configuration, only the active nanosheet channel layers 112, 114 and 116 collectively serve as FET channel layers of the nanosheet FET devices D1 and D2, thereby increasing the FET device width (or channel width), and thus the drive current of the FET device, for a given footprint area.

Figure 2:
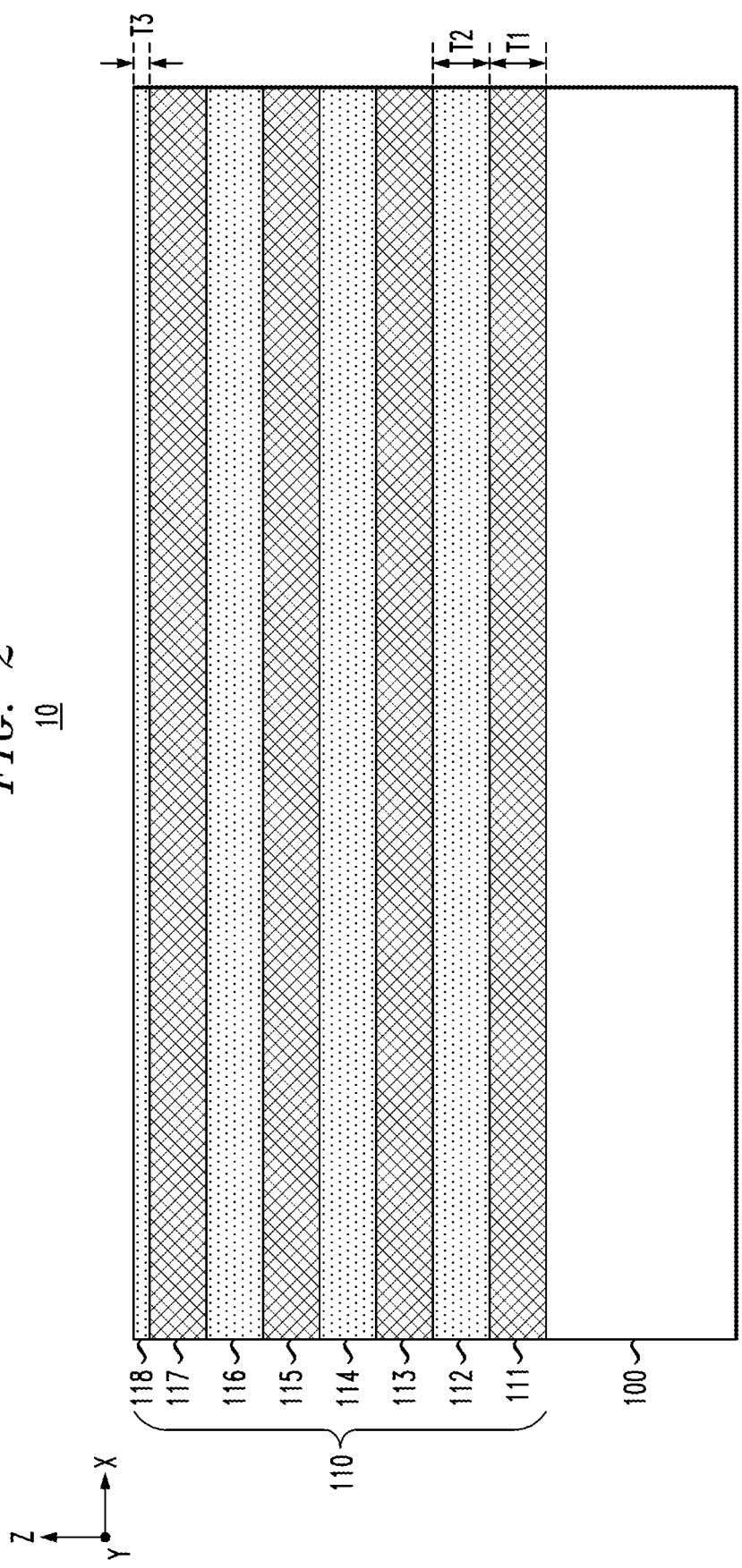

FIGS. 2-10B schematically illustrate a method for fabricating a semiconductor integrated circuit device comprising nanosheet FET devices having dummy nanosheet channel layers to protect active nanosheet channel layers from being damaged during work function metal patterning, according to an embodiment of the invention. For illustrative purposes, FIGS. 2-10B illustrate a process for fabricating the semiconductor integrated circuit device 10 of FIGS. 1A and 1B. To begin, FIG. 2 is a schematic cross-sectional side view (X-Z plane) of the semiconductor device 10 at initial stage of fabrication comprising a semiconductor substrate 100, and a nanosheet stack structure 110 formed on the semiconductor substrate 100. The nanosheet stack structure 110 comprises a stack of alternating semiconductor layers 111-118. While the semiconductor substrate 100 is illustrated as a generic substrate layer, it is to be understood that the semiconductor substrate 100 may comprise one of different types of semiconductor substrate structures and materials.

For example, in one embodiment, the semiconductor substrate 100 can be a bulk semiconductor substrate (e.g., wafer) that is formed of silicon (Si) or germanium (Ge), or other types of semiconductor substrate materials that are commonly used in bulk semiconductor fabrication processes such as a silicon-germanium alloy, compound semiconductor materials (e.g. III-V), etc. In another embodiment, the semiconductor substrate 100 may be an active semiconductor layer of an SOI (silicon-on-insulator) substrate, GeOI (germanium-on-insulator) substrate, or other type of semiconductor-on-insulator substrate, which comprises an insulating layer (e.g., oxide layer) disposed between a base substrate layer (e.g., silicon substrate) and the active semiconductor layer (e.g., Si, Ge, etc.) in which active circuit components are formed as part of a front-end-of-line (FEOL) structure. It is to be noted that in each drawing, the X-Y plane represents a plane that is parallel to the plane of the semiconductor substrate 100 (e.g., wafer) being processed.

The stack of alternating semiconductor layers 111-118 of the nanosheet stack structure 110 comprises sacrificial nanosheet layers 111, 113, 115, and 117, active nanosheet channel layers 112, 114, and 116, and a dummy nanosheet channel layer 118. Each active nanosheet channel layer 112, 114, and 116 is disposed between sacrificial nanosheet layers in the nanosheet stack structure 110. The stack of alternating semiconductor layers 111-119 comprises epitaxial semiconductor layers that are sequentially grown. For example, the sacrificial nanosheet layer 111 is epitaxially grown on a surface of the semiconductor substrate 100, the active nanosheet channel layer 112 is epitaxially grown on the sacrificial nanosheet layer 111, the sacrificial nanosheet layer 113 is epitaxially grown on the active nanosheet channel layer 112, the active nanosheet channel layer 114 is epitaxially grown on the sacrificial nanosheet layer 113, the sacrificial nanosheet layer 115 is epitaxially grown on the active nanosheet channel layer 114, the active nanosheet channel layer 116 is epitaxially grown on the sacrificial nanosheet layer 115, the sacrificial nanosheet layer 117 is epitaxially grown on the active nanosheet channel layer 116, and the dummy nanosheet channel layer 118 is epitaxially grown on the sacrificial nanosheet layer 117.

In one embodiment, the epitaxial semiconductor layers 111-118 comprise single crystal (monocrystalline) semiconductor materials, which are epitaxially grown using known methods such as chemical vapor deposition (CVD), metal-organic chemical vapor deposition (MOCVD), low pressure chemical vapor deposition (LPCVD), molecular beam epitaxy (MBE), vapor-phase epitaxy (VPE), liquid-phase epitaxy (LPE), metal organic molecular beam epitaxy (MOMBE), rapid thermal chemical vapor deposition (RT-CVD), low-energy plasma deposition (LEPD), ultra-high vacuum chemical vapor deposition (UHVCVD), atmospheric pressure chemical vapor deposition (APCVD), liquid-phase epitaxy (LPE), metal-organic chemical vapor deposition (MOCVD), or other known epitaxial growth techniques which are suitable for the given process flow. The types of materials that are utilized to form the epitaxial semiconductor layers 111-118 will depend on various factors such as the type of nanosheet FET device (p-type, or n-type), and the desired level of etch selectivity between the semiconductor layers, as well as providing sufficient lattice matching between the materials of the semiconductor layers to ensure proper (e.g., defect-free) epitaxial growth of the crystalline semiconductor layers 111-118.

For example, in one embodiment, the active nanosheet channel layers 112, 114, and 116 and the dummy nanosheet channel layer 118 are formed of epitaxial silicon (Si), which is suitable to serve as semiconductor channel layers for a nanosheet FET device. When the active nanosheet channel layers 112, 114, and 116 and dummy nanosheet channel layer 118 are formed of crystalline Si, the sacrificial nanosheet layers 111, 113, 115, and 117 (which serve as sacrificial layers that are subsequently etched away to release the active nanosheet channel layers 112, 114, and 116, and the dummy nanosheet channel layer 118), can be formed of an epitaxial silicon-germanium (SiGe) alloy. This allows the epitaxial SiGe material of the sacrificial nanosheet layers 111, 113, 115, and 117 to be etched selective to the epitaxial Si material of the active nanosheet channel layers 112, 114, and 116 and the dummy nanosheet channel layer 118 in a subsequent process step to "release" the active nanosheet channel layers 112, 114, and 116 and the dummy nanosheet channel layer 118.

In other embodiments, the active nanosheet channel layers 112, 114, and 116 and the dummy nanosheet channel layer 118 can be formed of an epitaxial SiGe material with a desired Ge concentration (optimized for device performance), and the sacrificial nanosheet layers 111, 113, 115, and 117 can be formed of a sacrificial semiconductor material (e.g., Si) that can be etched selective to the active nanosheet channel layers 112, 114, and 116 and the dummy nanosheet channel layer 118. While the nanosheet stack of epitaxial semiconductor layers 110 is shown to include three active nanosheet channel layers 112, 114, and 116, in other embodiments of the invention, the nanosheet stack 110 can be fabricated with more or less than three active nanosheet channel layers.

As shown in FIG. 2, the sacrificial nanosheet layers 111, 113, 115, and 117 are formed with a thickness T1, the active nanosheet channel layers 112, 114, and 116 are formed with a thickness T2, and the dummy nanosheet channel layer 118 is formed with a thickness T3. The thickness T1 of the sacrificial nanosheet layers 111, 113, 115, and 117 defines the spacing size above and below the active nanosheet channel layers 112, 114, and 116, in which high-k dielectric material and work function metal is formed. The size of the spacing (e.g., T1) and the type of WFM material(s) disposed in the spaces above and below the active nanosheet channel layers 112, 114, and 116 defines, in part, the threshold voltage (Vt) of the nanosheet FET device. In one embodiment, the thickness T1 of the sacrificial nanosheet layers 111, 113, 115, and 117 is in a range of about 8 nm to about 15 nm.

The thickness T2 of the epitaxial semiconductor layers 112, 114, and 116 defines a thickness of the active nanosheet channel layers of the nanosheet FET device. The thickness T2 of the active nanosheet channel layers 112, 114, and 116 defines, in part, the threshold voltage (Vt) of the nanosheet FET device (e.g., Vt increases with decreasing channel thickness). In one embodiment, the thickness T2 of the active nanosheet channel layers 112, 114, and 116 is in a range of about 6 nm to about 8 nm, although the active nanosheet channel layers 112, 114, and 116 can be formed with other thickness ranges, depending on the application.

Further, the thickness T3 of the dummy nanosheet channel layer 118 is selected so that the dummy nanosheet channel layer 118 is sufficiently thin with a high threshold voltage (Vt) so that the dummy nanosheet channel layer 118 does not "turn on" and operate as an active nanosheet channel layer during operation of the nanosheet FET devices. For example, in one embodiment, the thickness T3 of the dummy nanosheet channel layer 118 is in a range of about 2 nm to about 4 nm. The dummy nanosheet channel layer 118 is designed with reduced thickness (as compared to the thickness of the active nanosheet channel layers 112, 114, and 116) so that the dummy nanosheet channel layer 118 never turns on during device operation due to the high threshold voltage induced by the quantum confinement effect. In this regard, the dummy nanosheet channel layer 118 serves as a work function metal gate patterning damage reservoir to protect the underlying active nanosheet channel layers from being damages during subsequent processing steps, as discussed in further detail below.

A next phase of the process flow comprises patterning the nanosheet stack structure 110 to form an elongated nanosheet stack structure which defines a width W of the active channel layers of the nanosheet FET device D1 and D2, and forming an isolation layer (e.g., shallow trench isolation (STI) layers) in the surface of the semiconductor substrate 100 surrounding the patterned nanosheet stack structure. For example, FIG. 3 is a schematic top plan view (X-Y plane) of the semiconductor device structure of FIG. 2 after patterning the nanosheet stack structure 110 to form an elongated nanosheet stack structure 110A having a width W, and after forming an STI layer 105 surrounding the elongated nanosheet stack structure 110A. This initial patterning process results in the formation of the elongated nanosheet stack structure 110A having a width W which defines a width W of the nanosheet stack structures 110-1 and 110-2 of the nanosheet FET devices D1 and D2 (i.e., defines the width W of the active nanosheet channel layers 112, 114, and 116 of the nanosheet FET devices D1 and D2). In one embodiment, the width W is larger (e.g., 2× or more) than the thickness T2 of the active nanosheet channel layers 112, 114, and 116.

In one embodiment, the patterning process is performed by forming an etch mask (e.g., a photoresist mask) having openings which define an image of the STI layer 105, and using the etch mask to etch exposed portions of the nanosheet stack structure 110 (FIG. 2) down to the surface of the semiconductor substrate 100, and continue etching the substrate 100 to form trenches 110-1 at a depth D below the upper surface of the substrate 100 (see e.g., FIG. 4C). The etch mask can be formed using any suitable patterning process including, but not limited to, a photolithography process, or a multi-patterning process. The etching can be performed using one or more sequential dry etch processes with etch chemistries that are suitable to etch the materials of the semiconductor layers 111-118 of the nanosheet stack 110 and the semiconductor substrate 100.

In one embodiment, the STI layer 105 is formed by a process which comprises depositing a layer of insulating material over the surface of the semiconductor device structure to cover the elongated nanosheet structure 110A, planarizing the surface of the semiconductor device structure (via chemical mechanical polishing (CMP)) down to an upper surface of the elongated nanosheet structure 110A, and then performing an etch-back (or recess) process to recess the remaining layer of insulating material down to a target level which defines a thickness of the STI layer 105. In one embodiment, the STI layer 105 is formed with a thickness D that is substantially equal to the thickness (or depth) of the trenches 100-1 (i.e., coplanar with an upper surface of the semiconductor substrate 100). The STI layer 105 is formed of any type of insulating material, such an oxide material, which is suitable for the given fabrication process flow. The insulating material (e.g., silicon oxide) can be deposited and patterned using known techniques.

Figure 4A:
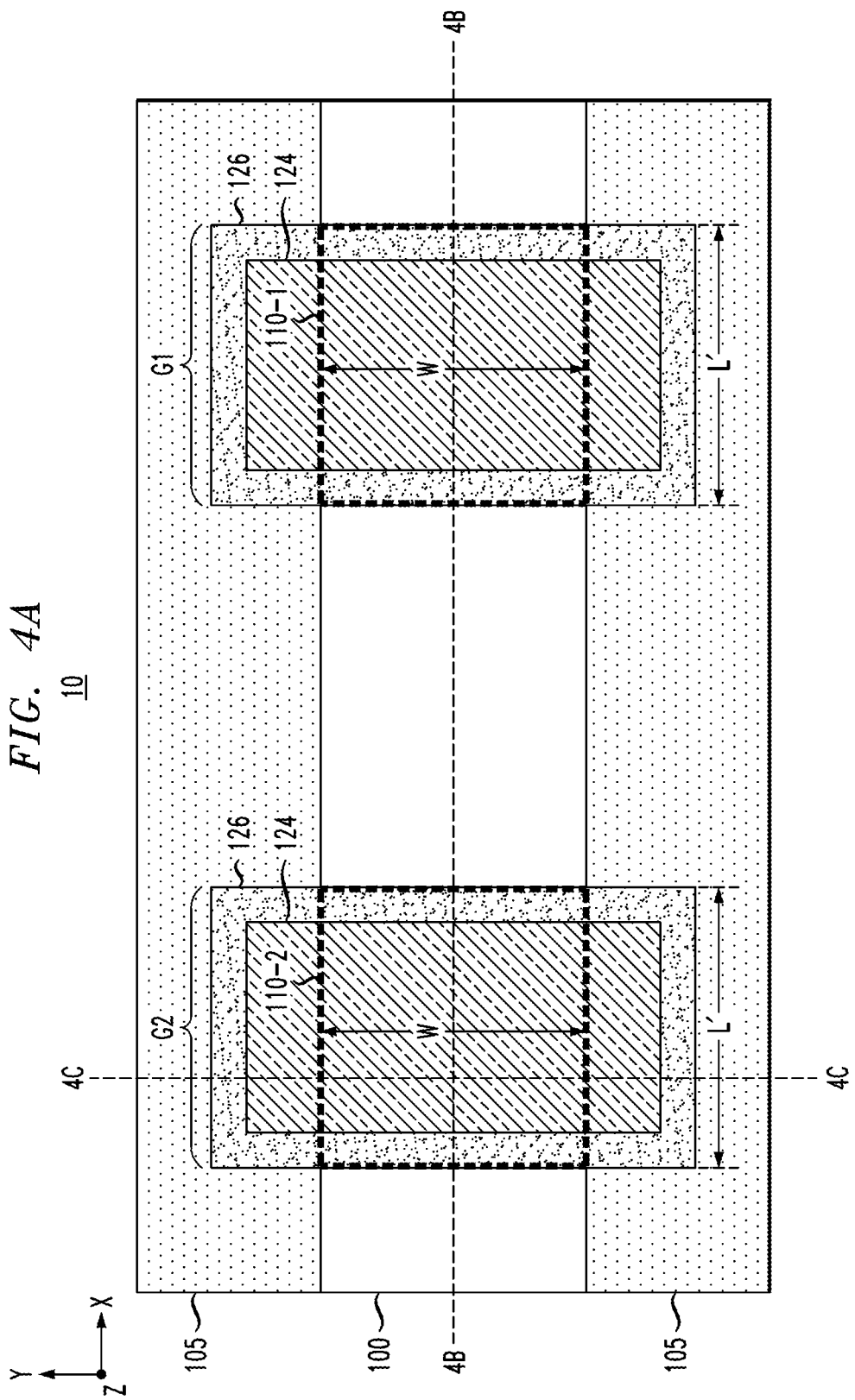
FIG. 4A is a schematic top plan view of the semiconductor device structure of FIG. 3 after forming first and second gate structures over the elongated nanosheet stack structure, and further patterning the elongated nanosheet stack structure to form the individual first and second nanosheet stack structures for first and second nanosheet FET devices.
Figure 4B:
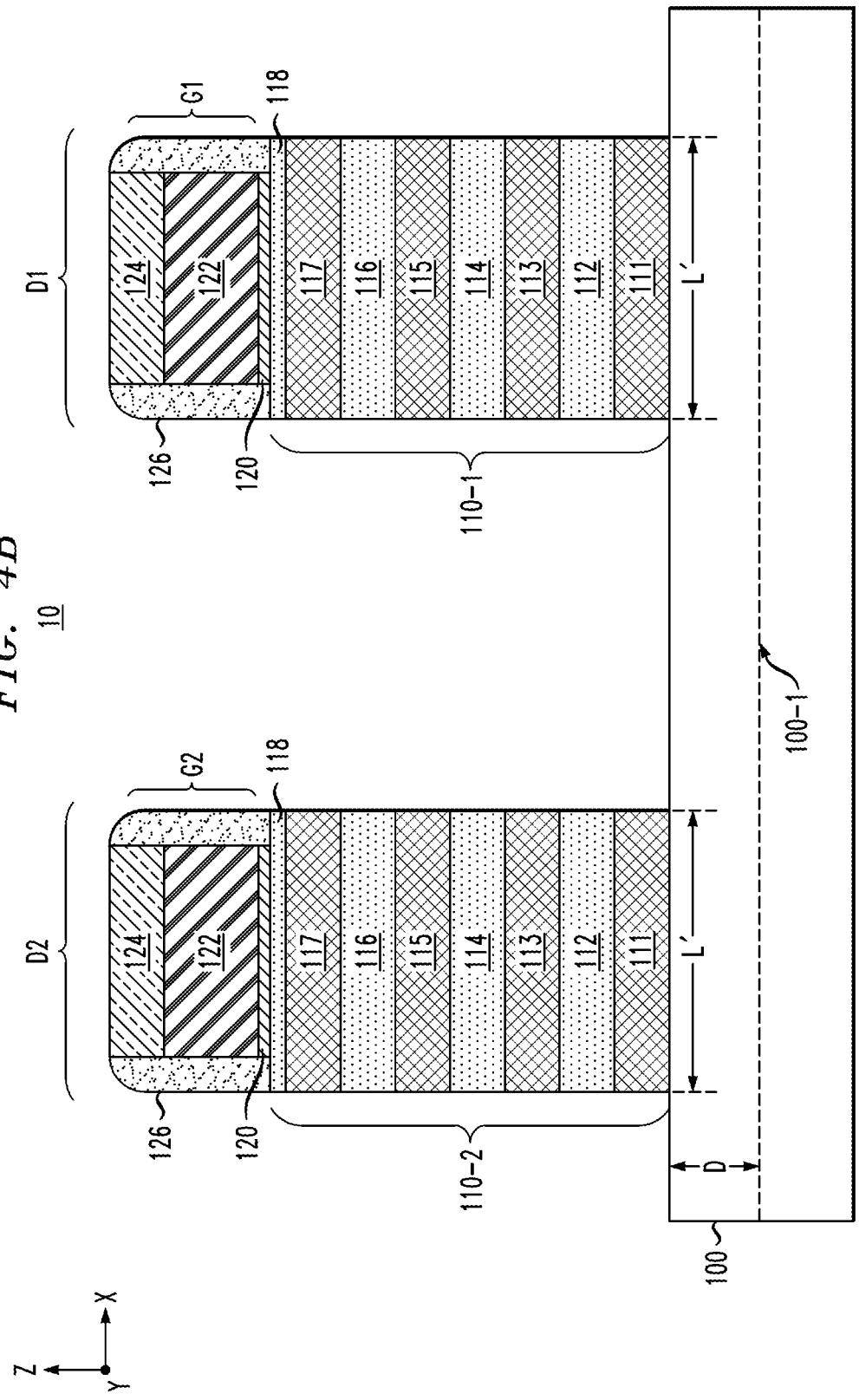
FIG. 4B is a schematic cross-sectional side view of the semiconductor device structure of FIG. 4A along line 4B-4B shown in FIG. 4A.
Figure 4C:
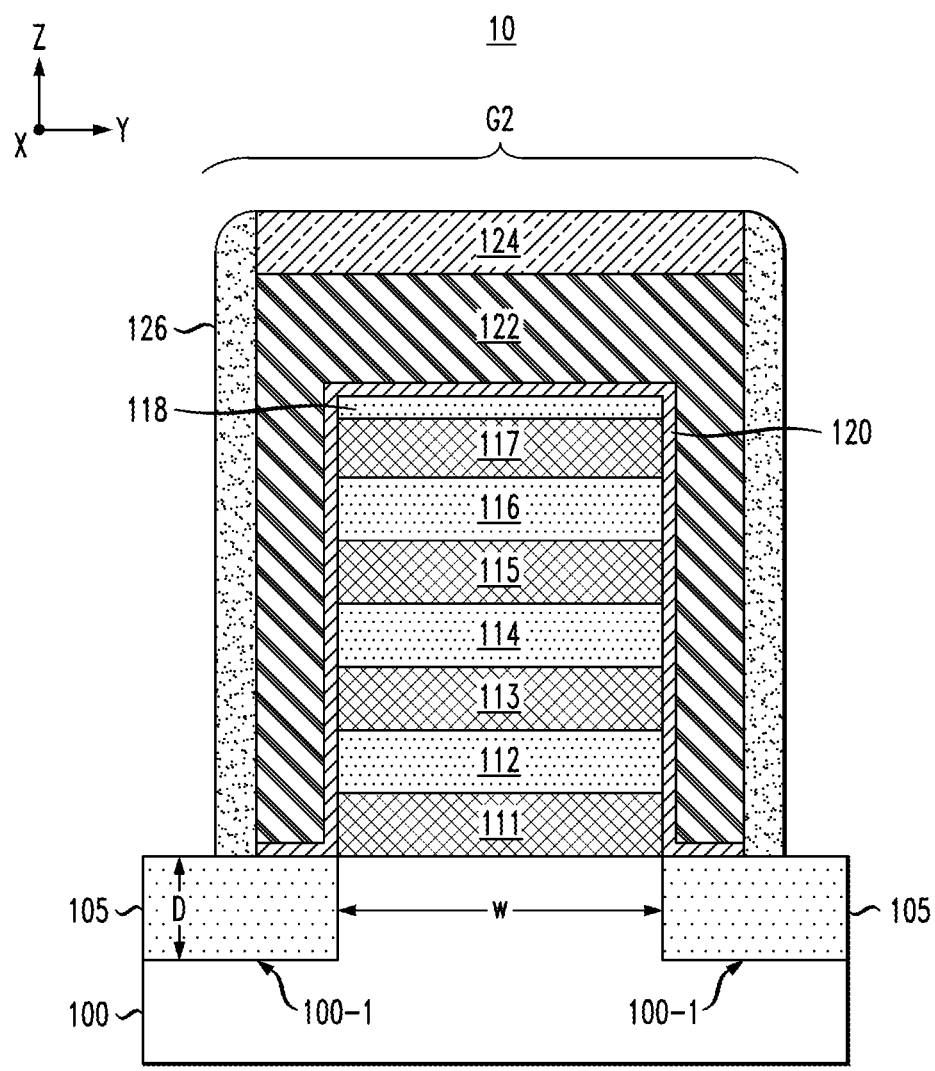
FIG. 4C is a schematic cross-sectional side view of the semiconductor device structure of FIG. 4A along line 4C-4C shown in FIG. 4A.

Next, FIGS. 4A, 4B, and 4C are schematic views of the semiconductor device structure of FIG. 3 after forming first and second gate structures G1 and G2 over the elongated nanosheet stack structure 110A, and further patterning the elongated nanosheet stack structure 110A to form the individual first and second nanosheet stack structures 110-1 and 110-2 for the first and second nanosheet FET devices D1 and D2. FIG. 4A is a schematic top plan view (X-Y plane) of the semiconductor device structure of FIG. 3, FIG. 4B is a schematic cross-sectional side view (X-Z plane) of the semiconductor device structure along line 4B-4B shown in FIG. 4A, and FIG. 4C is a schematic cross-sectional side view (Y-Z plane) of the semiconductor device structure along line 4C-4C shown in FIG. 4A.

As shown in FIGS. 4A, 4B, and 4C, the first and second gate structures G1 and G2 comprise dummy gate structures which each include a dummy gate oxide layer 120, a dummy gate electrode layer 122 (e.g., sacrificial polysilicon or amorphous silicon material). In addition, the gate structures G1 and G2 include the gate capping layers 124 and gate sidewall spacers 126. The dummy gate oxide layers 120 and the dummy gate electrode layers 122 of the gate structures G1 and G2 comprise sacrificial material which is subsequently removed as part of a replacement metal gate process and replaced with a high-k gate dielectric material and metallic material to form high-k metal gate structures. The semiconductor device structure shown in FIGS. 4A, 4B, and 4C is fabricated using known methods.

For example, starting with the semiconductor device structure of FIG. 3, a thin conformal layer of silicon oxide is deposited over the entire surface of the semiconductor device structure covering the upper surface and sidewalls of the elongated nanosheet stack structure 110A, followed by a blanket deposition of a sacrificial material such as polysilicon or amorphous silicon material over the conformal layer of silicon oxide to cover the elongated nanosheet stack structure 110A. A chemical mechanical polishing (CMP) process is then performed to planarize the layer of sacrificial material, and a hard mask layer is formed on the planarized surface of the polysilicon layer by depositing a layer of dielectric material such as silicon nitride (SiN), silicon carbon nitride (SiCN), silicon oxynitride (SiON), boron nitride (BN), silicon boron nitride (SiBN), siliconborocarbonitride (SiBCN), silicon oxycarbonitride (SiOCN), or other similar materials commonly used to form gate capping layers and gate sidewall spacers.

The hard mask layer is then patterned to form the gate capping layers 124, which define an image of the dummy gate structures. The gate capping layers 124 are then utilized as an etch hardmask to anisotropically etch (e.g., RIE) the sacrificial polysilicon and oxide layers to thereby form the dummy gate oxide layers 120 and the dummy gate electrodes 122 of the gate structures G1 and G2. The gate sidewall spacers 126 are then formed by depositing a conformal layer of dielectric material over the entire surface of the semiconductor device structure. The conformal layer of dielectric material can be formed of SiN, SiCN, SiON, BN, SiBN, SiBCN, SiOCN, or any other type of dielectric material that is commonly used to form insulating gate sidewall spacers of FET devices, and deposited using known techniques such as atomic layer deposition (ALD), CVD and PVD. The conformal layer of dielectric material is then patterned by performing an anisotropic dry etch process, such as RIE, to etch down the conformal layer of dielectric material in a vertical direction. This etch process is performed selective to the semiconductor materials of the elongated nanosheet stack structure 110A and the STI layer 105. The etch process results in the formation of the gate sidewall spacers 126, which surround the sidewall surfaces of the dummy gate electrodes 122 and the gate capping layers 124, as shown in FIGS. 4A, 4B, and 4C. The gate sidewall spacers 126 define gate regions of the nanosheet FET devices D1 and D2.

At some point in the vertical etch process to form the gate sidewall spacers 126, the portions of the conformal layer of dielectric material on the lateral surfaces of the semiconductor device structure (e.g., on the upper surfaces of the gate capping layers 124, the exposed upper surface of the dummy nanosheet channel layer 118 of the elongated nanosheet stack structure 110A, and the surface of the STI layer 105) will be fully etched away, but the anisotropic dry etch process continues to recess the gate capping layers 124 and pull down the vertical portions of the conformal layer of dielectric material on the sidewalls of the gate capping layers 124 and on the exposed sidewalls of the elongated nanosheet stack structure 110A. The anisotropic dry etch process is terminated when all of the dielectric material is removed from vertical sidewall surfaces of the exposed portions of the elongated nanosheet stack structure 110A outside of the gate region. In this regard, the gate capping layers 124 (etch hardmask) are initially formed with a thickness that is greater than a vertical height of the patterned elongated nanosheet structure 110A to ensure that when the dielectric material on the vertical sidewall surfaces of the elongated nanosheet structure 110A is fully recessed/pulled down to the surface of the STI layer 105, a portion of the gate capping layers 124 (with reduced thickness) remain on top of the dummy gate electrode layers 122, with the insulating gate sidewall spacers 126 fully covering the vertical sidewall surfaces of the dummy gate electrode layers 122.

After forming the gate sidewall spacers 126, an anisotropic dry etch process (e.g., RIE) is performed to etch down the exposed portions of the elongated nanosheet stack structure 110A in the source/drain regions adjacent to the gate structures G1 and G2 down to the upper surface of the semiconductor substrate 100 and the STI layer 105. This etch process results in forming the individual nanosheet stack structures 110-1 and 110-2 of the nanosheet FET devices D1 and D1 wherein the individual nanosheet stack structures 110-1 and 110-2 each have a defined length L' in the X-direction (see FIGS. 4A and 4C). The width W in the Y-direction (see FIGS. 4B and 4C) of the resulting nanosheet stack structures 110-1 and 110-2 are maintained since the sidewall surfaces of the nanosheet stack structures 110-1 and 110-2 which define the width W are covered by the dummy gate layers 120 and 122, and the gate sidewall spacers 126 (see, e.g., FIG. 4B).

Figure 5:
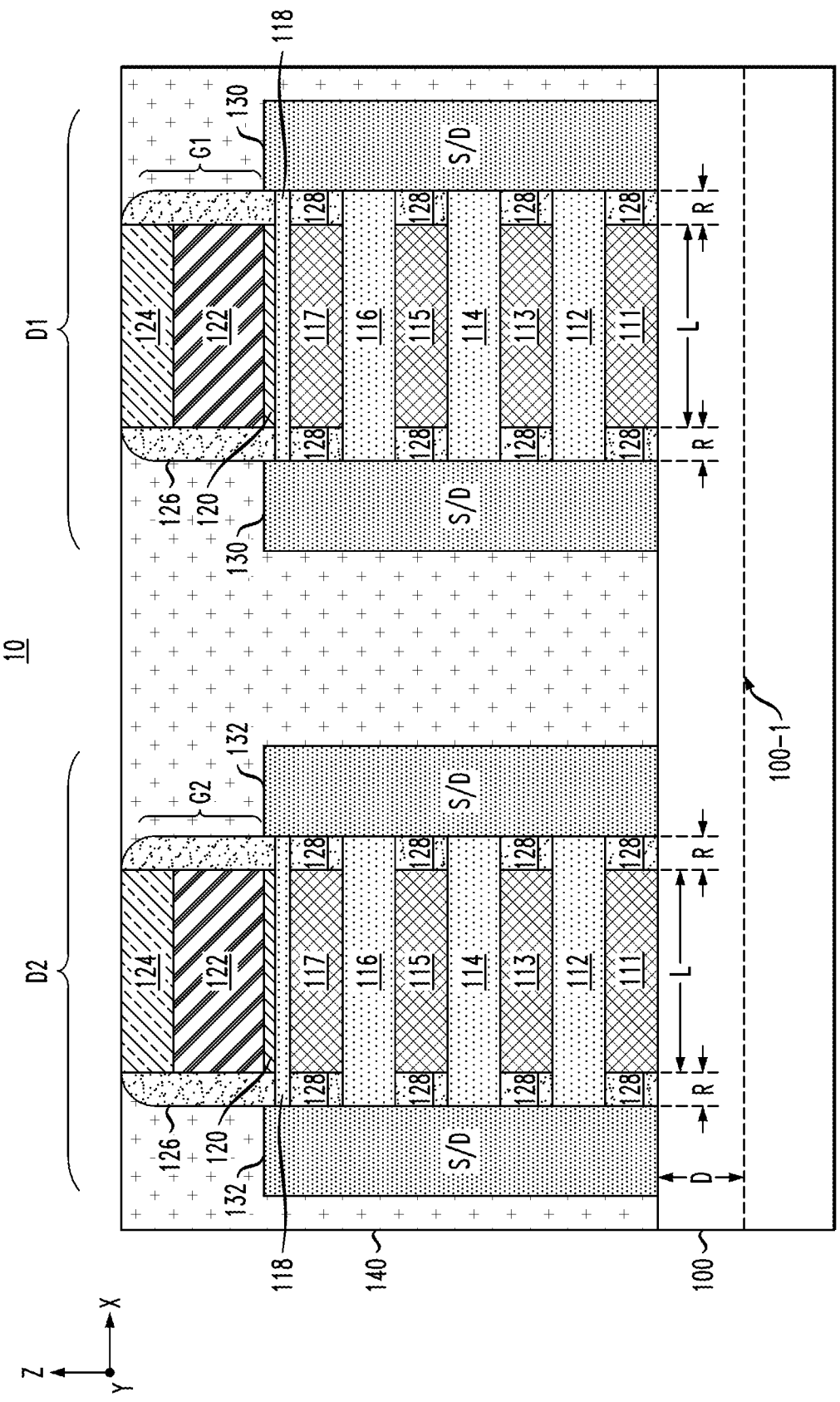

Next, FIG. 5 is a schematic cross-sectional side view of the semiconductor device structure shown in FIG. 4B after forming the inner spacers 128 for the first and second gate structures G1 and G2, after forming the epitaxial source/drain layers 130 and 132 for the first and second nanosheet FET devices D1 and D2, and after forming the ILD layer 140. In one embodiment, the inner spacers 128 are formed by a process which comprises laterally recessing exposed sidewall surfaces of sacrificial nanosheet layers 111, 113, 115, and 117 of the nanosheet stack structures 110-1 and 110-2 to form recesses in the sidewalls of the nanosheet stack structures 110-1 and 110-2. As shown in FIG. 5, the exposed sidewall surfaces of the sacrificial nanosheet layers 111, 113, 115, and 117 of the nanosheet stack structures 110-1 and 110-2 are laterally recessed to a depth R (in the X-direction). The amount of lateral recess R is controlled through a timed etch. In one embodiment, the depth of the recess R is substantially equal to the thickness of the gate sidewall spacers 126.

In one embodiment of the invention, the lateral etch process can be performed using an isotropic wet etch process with an etch solution that is suitable to etch the semiconductor material (e.g., SiGe) of the sacrificial nanosheet layers 111, 113, 115, and 117 of the nanosheet stack structures 110-1 and 110-2 selective to the semiconductor material (e.g., Si) of the active nanosheet channel layers 112, 114, and 116, and the dummy nanosheet channel layer 118 and other exposed elements. In another embodiment, an isotropic dry plasma etch process can be performed to laterally etch the exposed sidewall surfaces of the sacrificial nanosheet layers 111, 113, 115, and 117 selective to the active nanosheet channel layers 112, 114, and 116, the dummy nanosheet channel layer 118 and other exposed elements.

The recesses are then filled with dielectric material to form the inner spacers 128 (or embedded spacers) on the sidewalls of the nanosheet stack structures 110-1 and 110-2. In one embodiment, the inner spacers 128 are formed by depositing a conformal layer of dielectric material over the semiconductor device structure until the recesses are filled with dielectric material, followed by an etch back to remove the excess dielectric material. In one embodiment, the inner spacers 128 are formed of the same dielectric material used to form the gate sidewall spacers 126. For example, the inner spacers 128 can be formed of SiN, SiBCN, SiCON, or any other type of dielectric material (e.g., a low-k dielectric material having a k of less than 5) which is commonly used to form insulating gate sidewall spacers of FET devices. In one embodiment, the dielectric material is conformally deposited using a highly conformal deposition process, such as ALD, to ensure that the recesses are sufficiently filled with dielectric material. Other deposition methods such as CVD and PVD can be utilized to deposit a highly conformal layer of dielectric material to fill the recesses. The conformal layer of dielectric material can be etched back using an isotropic wet etch process to remove the excess dielectric material on the sidewalls of the nanosheet stack structures 110-1 and 110-2 and expose the sidewalls of the active nanosheet channel layers 112, 114, and 116, and the dummy nanosheet channel layer 118 while leaving the dielectric material in the recesses to form the inner spacers 128. The wet etch process may include, but is not limited to, buffered hydrofluoric acid (BHF), diluted hydrofluoric acid (DHF), hydrofluoric nitric acid (HNA), phosphoric acid, HF diluted by ethylene glycol (HF/EG), hydrochloric acid (HCl), or any combination thereof.

Following formation of the inner spacers 128, the source/drain layers 130 and 132 of the nanosheet FET devices D1 and D2 are formed by epitaxially growing semiconductor material (e.g., epitaxial Si material or SiGe material) on the exposed sidewall surfaces of the active nanosheet channel layers 112, 114, and 116 and the dummy nanosheet channel layer 118 using known techniques such as CVD, MOCVD, LPCVD, MBE, VPE, or other known epitaxial growth techniques which are suitable for the given process flow. The type of epitaxial semiconductor material that is used to form the source/drain layers 130 and 132 will vary depending on various factors including, but not limited to, the type of material of the active nanosheet channel layers 112, 114, and 116, the device type (e.g., n-type or p-type) of the nanosheet FET devices D1 and D2, etc.

The epitaxial growth of the semiconductor material on the exposed sidewall surfaces of the active nanosheet channel layers 112, 114, and 116 and the dummy nanosheet channel layers 118 is performed so that the epitaxial material merges to form (i) the source/drain layers 130 on the vertical sidewalls of the nanosheet stack structure 110-1 and (ii) the source/drain layers 132 on the vertical sidewalls of the nanosheet stack structure 110-2, as schematically shown in FIG. 5. Furthermore, in one embodiment, the source/drain layers 130 and 132 are doped using known techniques. For example, in one embodiment, the source/drain layers 130 and 132 are "in-situ" doped during epitaxial growth by adding a dopant gas to the source deposition gas (i.e., the Si-containing gas). Exemplary dopant gases may include a boron-containing gas such as $BH_3$ for pFETs or a phosphorus or arsenic containing gas such as $PH_3$ or $AsH_3$ for nFETs, wherein the concentration of impurity in the gas phase determines its concentration in the epitaxially grown semiconductor material. Although not specifically shown in FIG. 5, prior to forming the source/drain layers 130 and 132, an isolation layer can be formed on or within a recess of the exposed surface of the substrate 100 to provide isolation between the substrate 100 and the source/drain layers 130 and 132 of the nanosheet FET devices D1 and D2.

In addition, in one embodiment of the invention, a thermal anneal process is performed following the epitaxial growth of the doping of source/drain layers 132 and 132 to cause dopants to be injected into the end portions of the active nanosheet channel layers 112, 114, and 116 that are in contact with the epitaxial semiconductor material of the source/drain layers 130 and 132. This process effectively results in extending the source/drain regions 130 and 132 into the semiconductor material of the end portions of the active nanosheet channel layers 112, 114, and 116 of the nanosheet stack structures 110-1 and 110-2.

Following the formation of the epitaxial source/drain layers 130 and 132, the process flow continues with forming the ILD layer 140 (or pre-metal dielectric (PMD) layer) to encapsulate the dummy gate structures nanosheet FET devices D1 and D2 in dielectric/insulating material, prior to commencing a replacement metal gate process. In one embodiment, the ILD layer 140 is formed by depositing a blanket layer of dielectric/insulating material over the semiconductor device structure and planarizing the layer of dielectric/insulating material down to the gate capping layers 124 to form the ILD layer 140, as shown schematically shown in FIG. 4. The ILD layer 140 may comprise any suitable insulating/dielectric material that is commonly utilized in semiconductor process technologies including, but not limited to, silicon oxide, silicon nitride, silicon oxynitride, SiCOH, SiCH, SiCNH, or other types of silicon-based low-k dielectrics (e.g., k less than about 4.0), porous dielectrics, known ULK (ultra-low-k) dielectric materials (with k less than about 2.5), or any suitable combination of those materials. The dielectric/insulating material of the ILD layer 140 is deposited using known deposition techniques, such as, for example, ALD, CVD, PECVD, PVD, or spin-on deposition. In one embodiment, the layer of dielectric/insulating material is planarized using a standard planarization process such as CMP to remove the overburden dielectric/insulating down to the upper surface of the dummy gate capping layers 124. In some embodiments, the ILD layer 140 comprises a silicon nitride liner on the surfaces of dummy gate, spacers, and source/drain, and silicon oxide filling the remaining space.

Figure 6A:
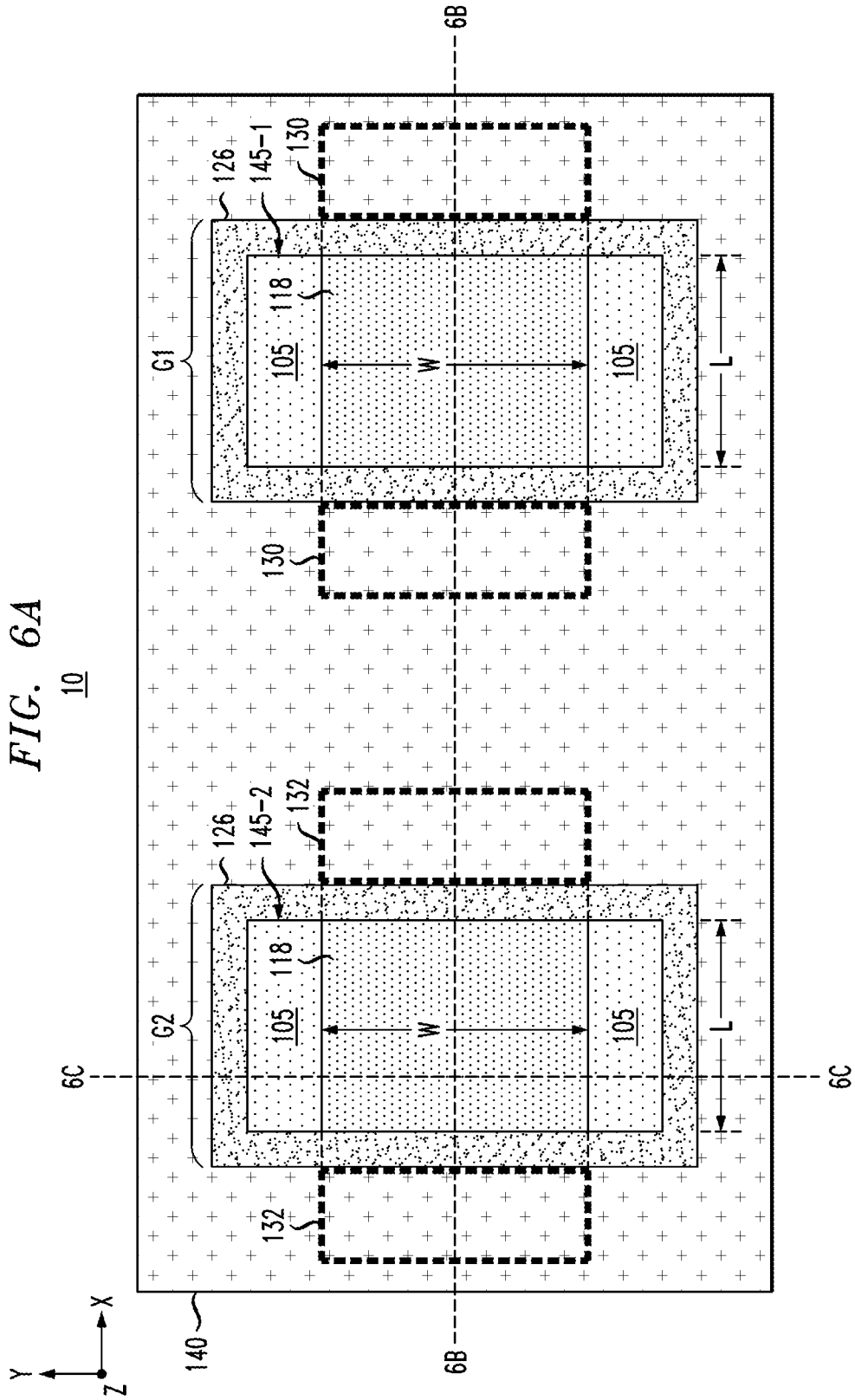
FIG. 6A is a schematic top plan view of the semiconductor device structure shown in FIG. 5 after removing gate capping layers sacrificial dummy gate material of the first and second gate structures to form first and second open gate regions, and after removing the sacrificial nanosheet layers exposed within the first and second open gate regions to release the active nanosheet channel layers and the dummy nanosheet channel layers of the first and second nanosheet stack structures of the first and second nanosheet FET devices.
Figure 6C:
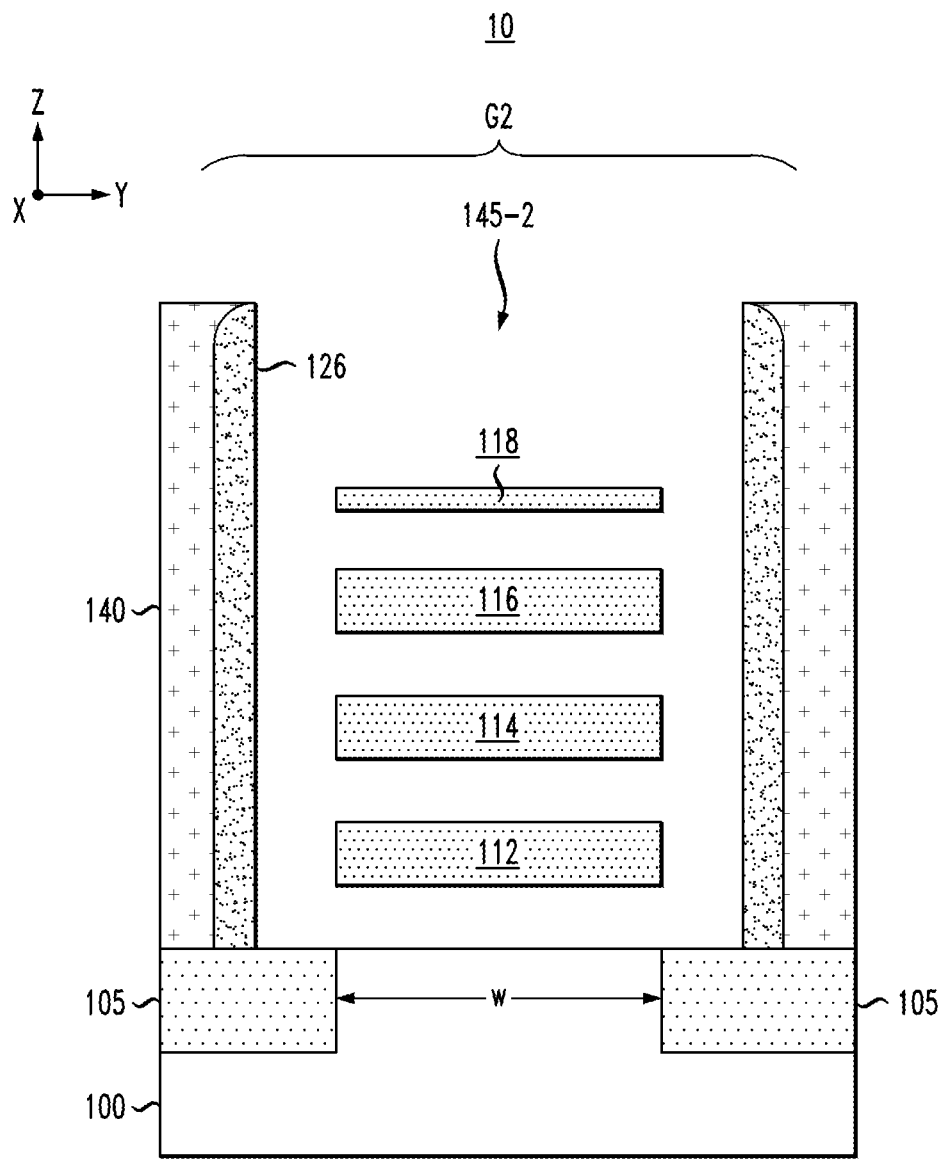
FIG. 6C is a schematic cross-sectional side view of the semiconductor device structure of FIG. 6A along line 6C-6C shown in FIG. 6A.

Following the formation of the ILD layer 140, a replacement metal gate process is performed to replace the sacrificial dummy gate material with a metal gate structure, using a process flow as schematically illustrated in FIG. 6A through FIG. 10B. For example, FIGS. 6A, 6B, and 6C are schematic views of the semiconductor device structure shown in FIG. 5 after removing the gate capping layers 124 and the sacrificial dummy gate material (dummy oxide layers 120 and dummy gate electrode layers 122) of the first and second gate structures G1 and G2 to form first and second open gate regions 145-1 and 145-2, and after removing the sacrificial nanosheet layers 111, 113, 115, and 117 exposed within the first and second open gate regions 145-1 and 145-2 to release the active nanosheet channel layers 112, 114 and 116 and the dummy nanosheet channel layers 118 of the first and second nanosheet stack structures 110-1 and 110-2 of the first and second nanosheet FET devices D1 and D2. FIG. 6B is a schematic cross-sectional side view (X-Z plane) of the semiconductor device structure along line 6B-6B shown in FIG. 6A, and FIG. 6C is a schematic cross-sectional side view (Y-Z plane) of the semiconductor device structure along line 6C-6C shown in FIG. 6A.

In one embodiment, the dummy gate capping layers 124 can be removed by planarizing (e.g., via CMP) the surface of the semiconductor device structure of FIG. 5 down to the upper surface of the dummy gate electrode layers 122. In another embodiment, the dielectric material of the dummy gate capping layers 124 (e.g., SiN) can be etched away selective to the materials of gate sidewall spacers 126 (e.g., SiBCN) and the ILD layer 140 (e.g., silicon oxide) to expose the underlying dummy gate electrode layers 122. The dummy gate electrode layers 122 (e.g., polysilicon material) is then etched away using known etching techniques and etch chemistries. For example, the sacrificial dummy gate polysilicon material can be removed using a selective dry etch or wet etch process with suitable etch chemistries, including ammonium hydroxide ($NH_4OH$), tetramethylammonium hydroxide (TMAH), or SF6 plasma. The etching of the dummy poly gate layer 122 is selective to, e.g., the underlying dummy gate oxide layers 120, to thereby protect the semiconductor materials of the nanosheet stack structures 110-1 and 110-2 from being etched during the poly etch process. After removing the sacrificial material of the dummy gate electrode layers 122, an oxide etch process is performed to etch away the dummy gate oxide layers 120 selective to, e.g., the active nanosheet channel layers 112, 114, and 116 and the dummy nanosheet channel layers 118. In this manner, the sacrificial materials (e.g., dummy polysilicon and oxide layers) of the dummy gates can be etched away without damaging the active nanosheet channel layers 112, 114, and 116, or removing the dummy nanosheet channel layers 118.

After removing the dummy gate oxide layers 120, an etch process is performed to selectively etch away the sacrificial nanosheet layers 111, 113, 115, and 117 of the nanosheet stack structures 110-1 and 110-2 to release the active nanosheet channel layers 112, 114, and 116, and the dummy nanosheet channel layers 118, thereby allowing the open gate regions 145-1 and 145-2 to extend into spaces between and adjacent to the active nanosheet channel layers 112, 114, and 116 and the dummy nanosheet channel layers 118. In this embodiment, the open gate regions 145-1 and 145-2 include the open spaces within the inner region defined by the gate sidewall spacers 126 and the inner spacers 128.

The sacrificial nanosheet layers 111, 113, 115, and 117 (e.g., SiGe layers) can be etched away selective to the active nanosheet channel layers 112, 114, and 116 and the dummy nanosheet channel layers 118 (Si layers) using a wet etch process, for example. In one embodiment, the SiGe material of the sacrificial nanosheet layers 111, 113, 115, and 117 can be selectively etched (with high etch selectivity) using a gas phase HCl (hydrochloric acid) or wet etch solution to laterally etch the SiGe material of the sacrificial nanosheet layers 111, 113, 115, and 117 selective to the Si material of the active nanosheet channel layers 112, 114, and 116 and the dummy nanosheet channel layers 118. The gas phase HCl (hydrochloric acid) provides high etch selectivity when, for example, the active nanosheet channel layers 112, 114, and 116 and the dummy nanosheet channel layers 118 are formed of Si or SiGe with a lower Ge concentration than the SiGe material of the sacrificial nanosheet layers 111, 113, 115, and 117.

Figure 7:
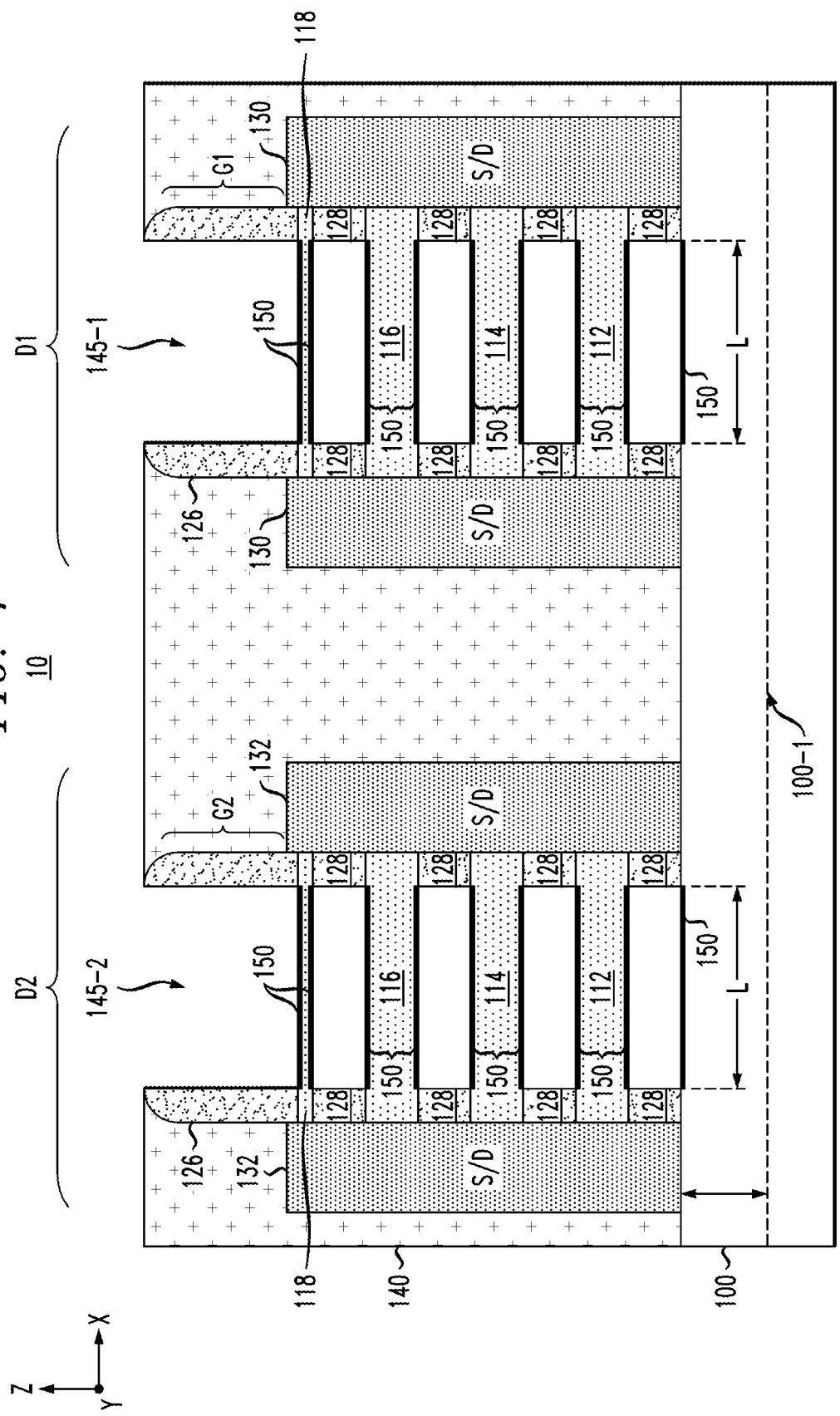

FIG. 7 is a schematic cross-sectional side view of the semiconductor device structure shown in FIG. 6B after forming interfacial oxide layers 150 on exposed silicon surfaces of the active nanosheet channel layers 112, 114, and 116 and the dummy nanosheet channel layers 118 within the first and second open gate regions 145-1 and 145-2 of the first and second gate structures G1 and G2. As is known in the art, the use of high-k gate dielectric materials is problematic in that such dielectric materials typically do not interface well with silicon layers. For example, high-k gate dielectric materials do not passivate a silicon surface, which results in a large number of interface traps and charges and other issues which can degrade device performance.

As such, in one exemplary embodiment as discussed herein, before depositing high-k dielectric material to form the high-k gate dielectric layers, a channel pre-clean process is performed to clean the exposed silicon surfaces of the active nanosheet channel layers 112, 114 and 116, and the dummy nanosheet channel layers 118, which is then followed by a thermal oxidation process to grow the thin interfacial silicon oxide layers 150 on the exposed surfaces of the active nanosheet channel layers 112, 114 and 116, and the dummy nanosheet channel layers 118 within the open gate regions 145-1 and 145-2, as schematically shown in FIG. 7. As further shown in FIG. 7, the chemical oxidation process also results in the formation of a thin silicon oxide layer 150 on the exposed surface regions of the semiconductor substrate 100 below the active nanosheet channel layers 112 within the open gate regions 145-1 and 142. It is to be understood that the formation of the interfacial silicon oxide layers 150 is an optional step and that in other embodiments of the invention, a high-k dielectric material of the HKMG structures can be formed on the exposed silicon surfaces of the active nanosheet channel layers 112, 114, and 116, and on the dummy nanosheet channel layers 118, without initially forming the thin interfacial oxide layers 150.

In one exemplary embodiment, the interfacial silicon oxide layers 150 are formed using a chemical oxidation process in an ozonated deionized water comprising ozone, and a suitable oxidation temperature, ozone concentration in the deionized water, and chemical oxidation process time to form thin interfacial silicon oxide layers 150. The interfacial layers 150 are formed by oxidizing the exposed silicon surfaces of the active nanosheet channel layers 112, 114 and 116, and the dummy nanosheet channel layers 118 to form the interfacial silicon oxide layers 150 with a thickness in a range of about 5 angstroms to about 10 angstroms (i.e., about 0.5 nm to about 1 nm). In this regard, the chemical oxidation on the exposed top and bottom surfaces of the active nanosheet channel layers 112, 114 and 116, and the dummy nanosheet channel layers 118 effectively results in a reduction of the thickness of the silicon channel material of the active nanosheet channel layers 112, 114 and 116, and the dummy nanosheet channel layers 118 in a range of about 1 nm to about 2 nm. For example, assuming the active nanosheet channel layers 112, 114 and 116 are formed with a thickness T2 (FIG. 2) of 7 nm and the interfacial layers 150 are formed with a thickness of 0.5 nm, the active nanosheet channel layers 112, 114 and 116 will essentially have a reduced thickness of 6 nm.

Figure 8A:
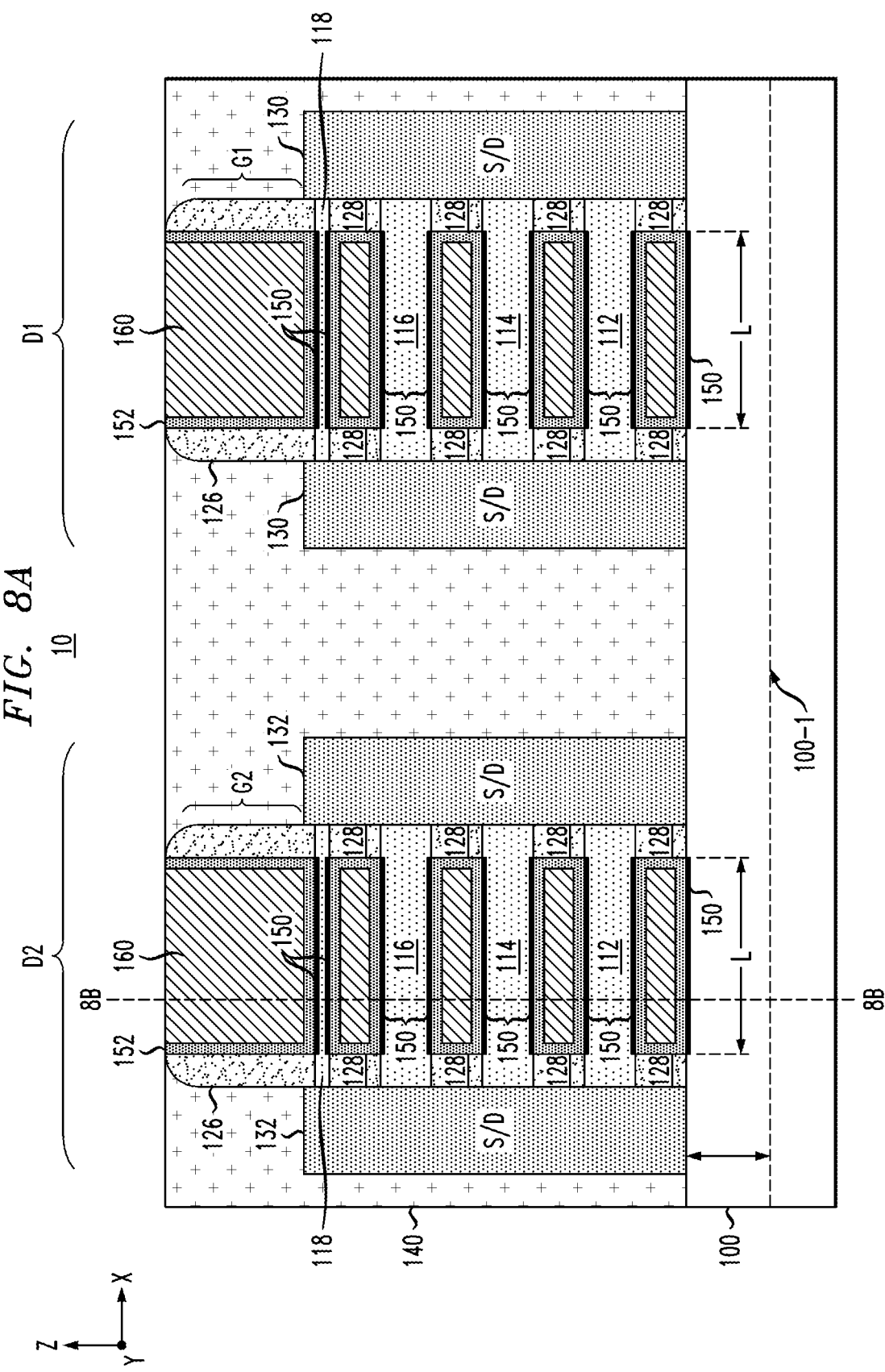
FIG. 8A is a schematic cross-sectional side view of the semiconductor device structure shown in FIG. 7 after forming thin, conformal high-k gate dielectric layers on exposed surfaces within the first and second open gate regions, and after filling the first and second open gate regions with a first layer of work function metal.
Figure 8B:
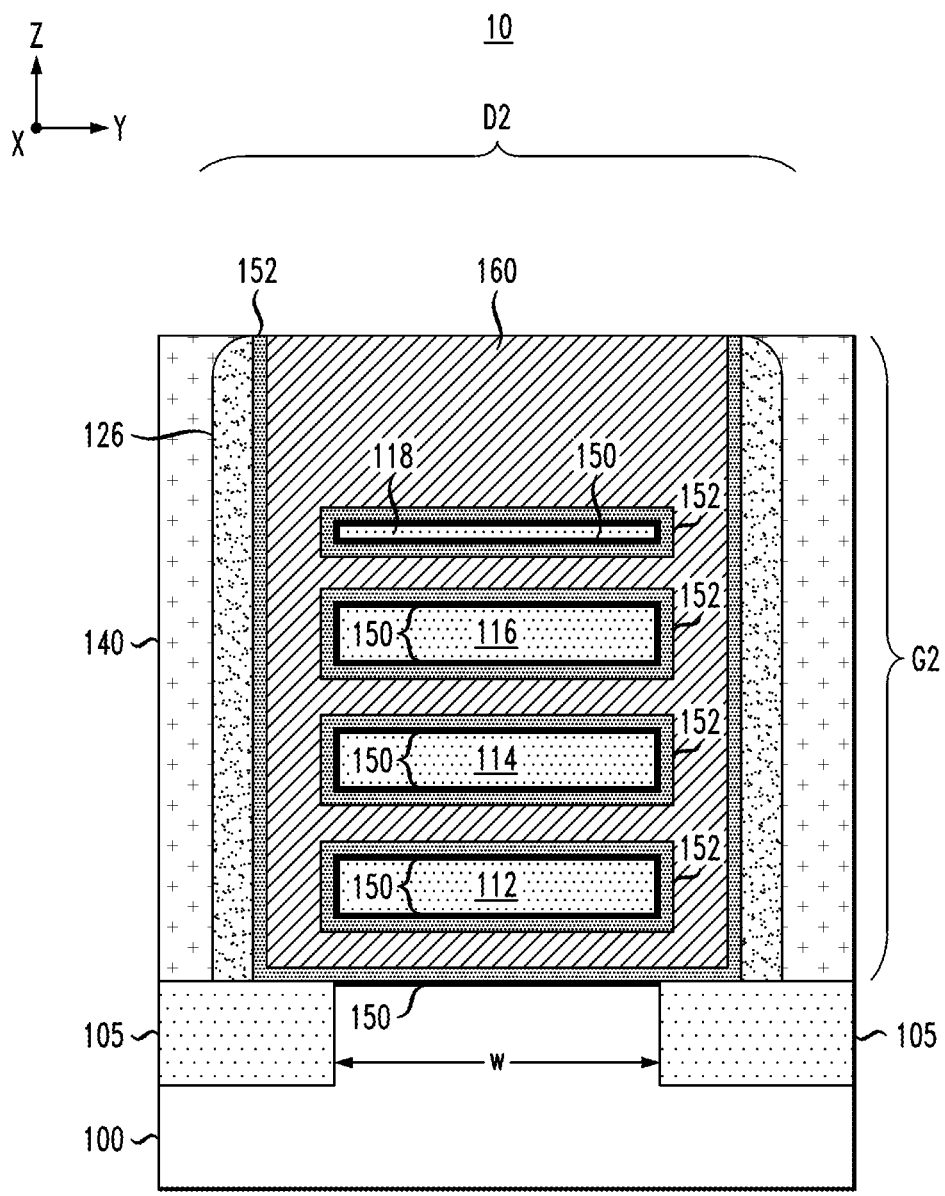
FIG. 8B is a schematic cross-sectional side view of the semiconductor device structure of FIG. 8A along line 8B-8B shown in FIG. 8A.

Next, FIG. 8A is a schematic cross-sectional side view of the semiconductor device structure shown in FIG. 7 after forming thin, conformal high-k gate dielectric layers 152 on exposed surfaces within the first and second open gate regions 145-1 and 145-2, and after filling the first and second open gate regions 145-1 and 145-2 with a first layer of work function metal 160. FIG. 8B is a schematic cross-sectional side view of the semiconductor device structure of FIG. 8A along line 8B-8B shown in FIG. 8A. In one embodiment, the gate dielectric layers 152 are formed by depositing one or more conformal layers of gate dielectric material over the exposed surfaces within the open gate regions 145-1 and 145-2 of the semiconductor device structure shown in FIG. 7, which results in the formation of high-k gate dielectric layers on the surfaces of the active nanosheet channel layers 112, 114, and 116, and the dummy nanosheet channel layers 118 (as well as the bottom and sidewall surfaces of the open gate regions 145-1 and 145-2). The gate dielectric layers 152 are formed of a high-k dielectric material having a dielectric constant (k) of about 3.9 or greater.

For example, the gate dielectric material can include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric material may further include dopants such as lanthanum, aluminum. In one embodiment of the invention, the conformal gate dielectric layers 152 are formed with a thickness in a range of about 0.5 nm to about 2.5 nm, which will vary depending on the target application. The conformal layer of gate dielectric material is deposited using known methods such as ALD, for example, which allows for high conformality of the gate dielectric material.

The first layer of work function metal 160 may comprise one or more layers of metallic material, including, but not limited to, TiN, TaN, TiAlC, Zr, W, Hf, Ti, Al, Ru, Pa, TiAl, ZrAl, WAl, TaAl, HfAl, TiAlC, TaC, TiC, TaMgC, or types, compositions, or alloys of work function metals that are commonly used to obtain target work functions which are suitable for the type (e.g., n-type or p-type) of nanosheet FET devices that are to be formed. The first layer of work function metal 160 is deposited using known methods such as ALD, CVD, etc. In one embodiment, as shown in FIGS. 8A and 8B, the first layer of work function metal 160 completely fills the gate regions including the spaces above and below the active nanosheet channel layers 112, 114, and 116 and the dummy nanosheet channel layers 118. Indeed, in this embodiment, as noted above, the thickness (e.g., T1, FIG. 1) of the sacrificial nanosheet layers 111, 113, 115, and 117 is selected to be in a range of about 8 nm to about 10 nm. Assuming the high-k gate dielectric layers 152 are formed with a thickness of about 2 nm, a space of about 4 nm to about 6 nm remains above and below the active nanosheet channel layers 112, 114, and 116 after formation of the high-k dielectric layers 152, wherein the remaining space is filled with the work function metal 160. This is sufficient for short-channel length nanosheet FET devices (where the channel length L is about 15 nm or less).

Figure 9:
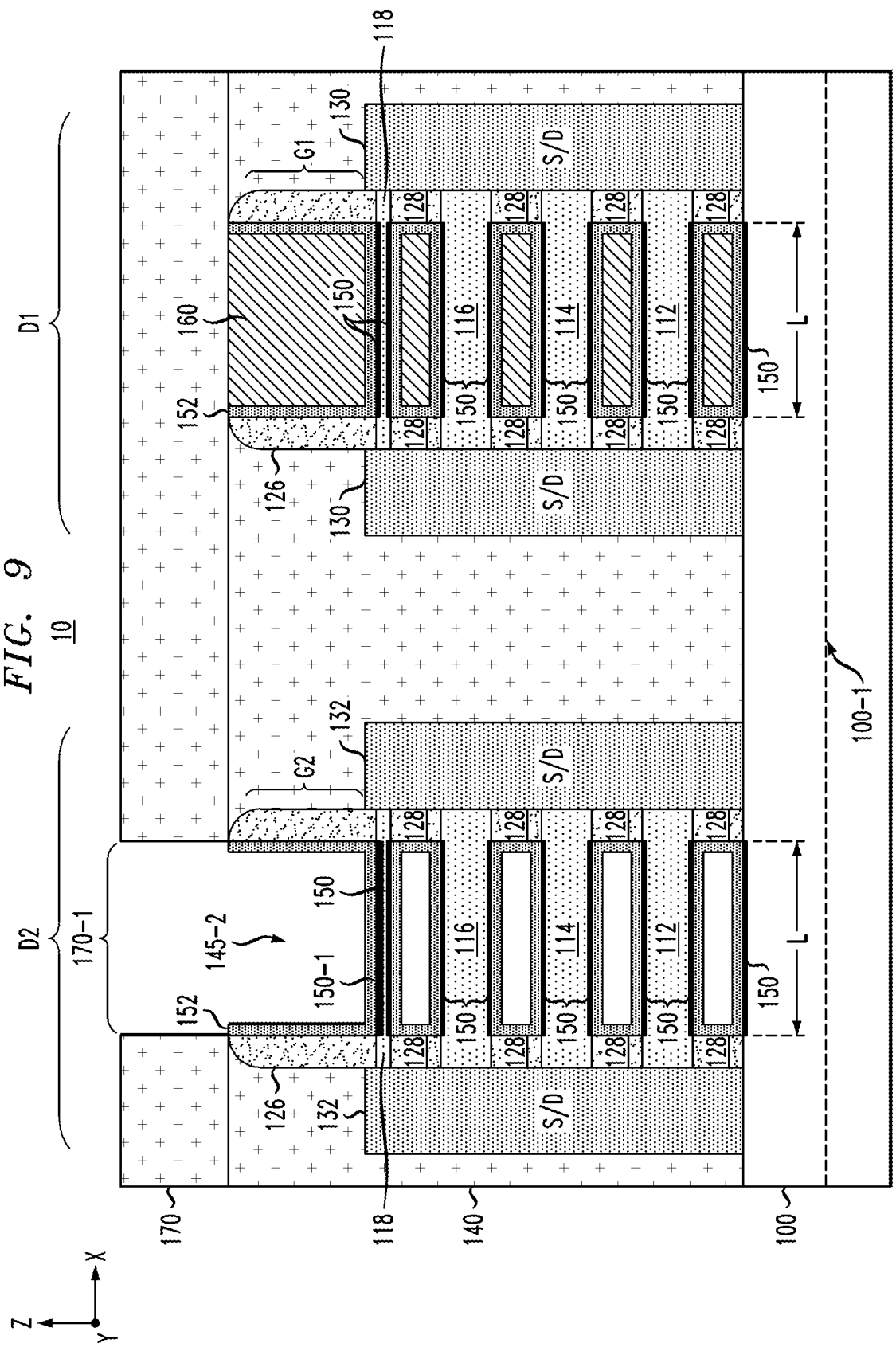
Figure 10A:
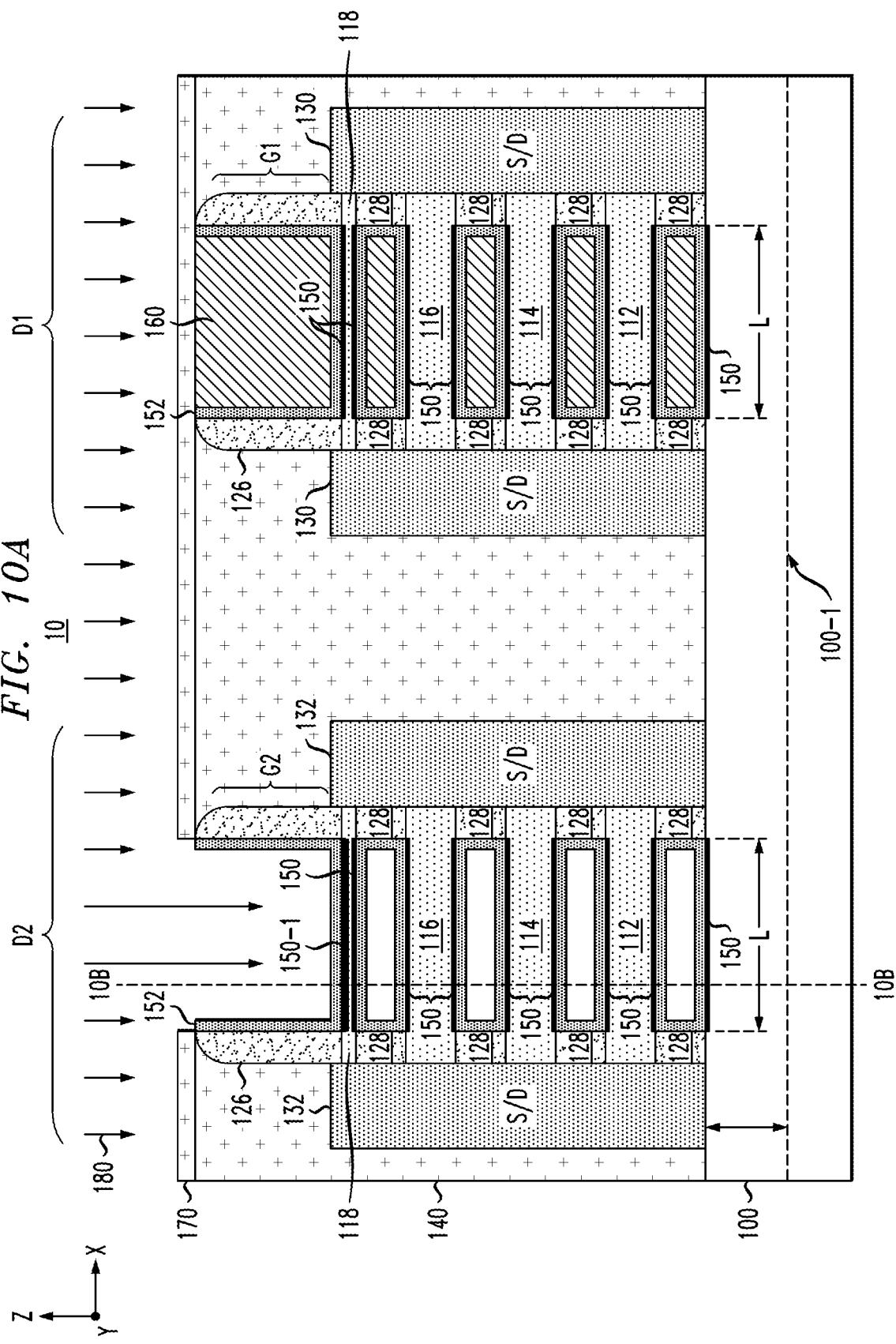
FIG. 10A schematically illustrate a plasma etch process that is performed on the semiconductor device structure of FIG. 9 to remove the etch mask.
Figure 10B:
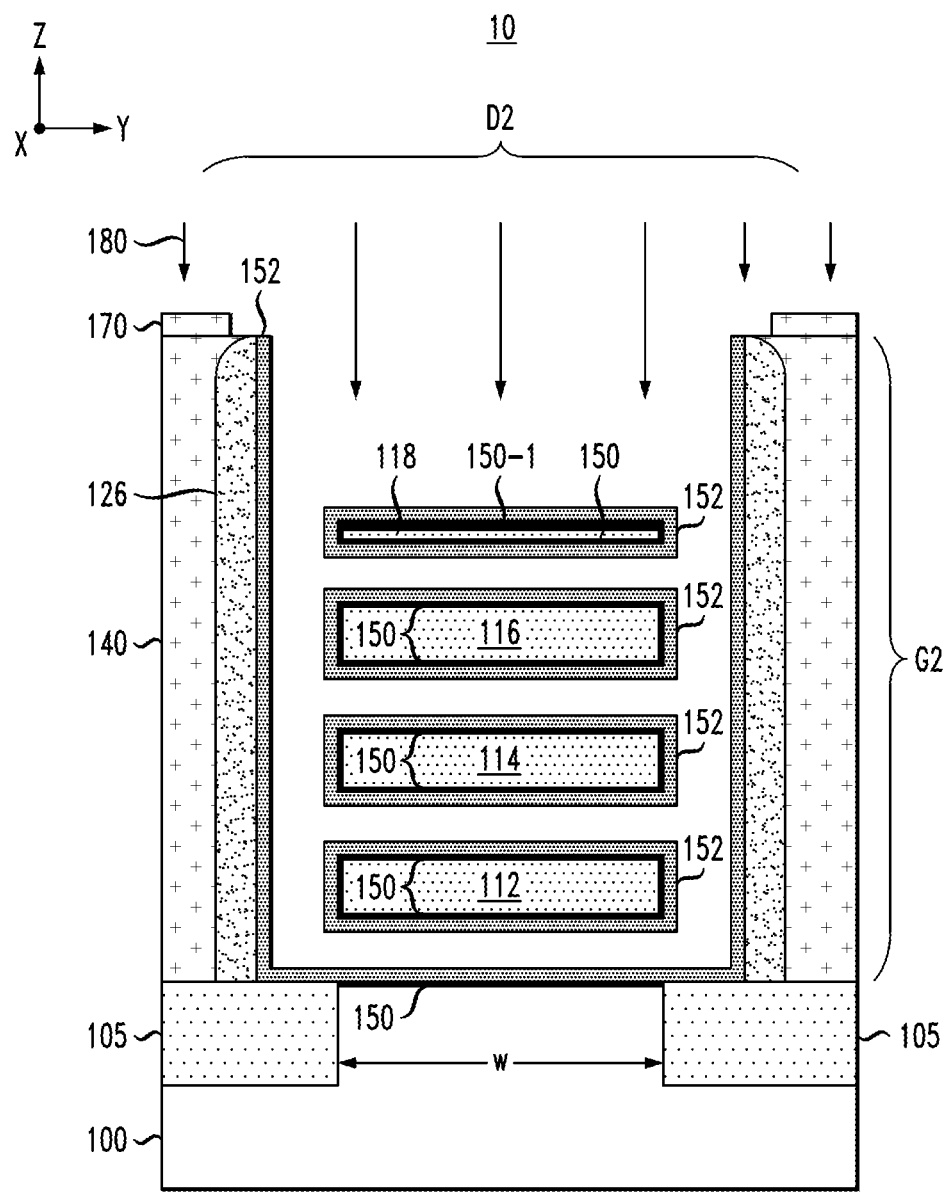

While the first layer of work function metal 160 is selected to set the threshold voltage (Vt) for a first type of nanosheet FET device (e.g., n-type FET device), the first layer of work function 160 metal will be removed from the gate regions of each second type of nanosheet FET device (e.g., p-type FET device) and replaced with a second layer of work function metal which is selected to set the threshold voltage (Vt) for the second type of nanosheet FET device, using a process flow as schematically illustrated in FIGS. 9, 10A and 10B.

In particular, FIG. 9 is a schematic cross-sectional side view of the semiconductor device structure shown in FIG. 8A after forming an etch mask 170 with an opening 170-1 that exposes the gate region of the second nanosheet FET device D2 while covering the gate region of the first nanosheet device D1, and after removing the first layer of work function metal 160 from the gate region of the second nanosheet FET device D2. In one embodiment, the etch mask 170 is formed by depositing and photolithographically patterning an organic planarizing layer (OPL). The opening 170-1 of the etch mask 170 is formed by etching the OPL material using a directional dry etch process such as RIE.

The first layer of work function metal 160 is then removed from the gate G2 of the nanosheet FET device D2 to reopen the gate region 145-2. In one embodiment, the first layer of work function metal 160 is removed using an isotropic wet etch process with an etch chemistry that is configured to etch away the first layer of work function metal 160 selective to the surrounding materials such as the high-k dielectric layer 152 within the gate region 145-2. For example, in an exemplary embodiment wherein the first layer of work function metal 160 comprises TiN, a wet etch solution such as, but not limited to, SC1 ($NH_4/H_2O_2/H_2O$=1:2:5) or SPM ($H_2SO_4/H_2O_2$=10:1) can be utilized to isotropically etch away the first layer of work function metal 160 selective to the high-k dielectric material of the gate dielectric layers 152.

During the RIE process to etch the OPL material and form the opening 170-1 of the etch mask 170 layer, oxygen atoms within the etch environment (which are contained within the etch plasma or oxygen by products) can penetrate through the first layer of work function metal 160 and the high-k dielectric layer 152 into the silicon surface of the dummy nanosheet channel layer 118 and grow a thicker interfacial silicon oxide layer 150-1 on the upper surface of the dummy nanosheet channel layer 118. In this instance, the dummy nanosheet channel layer 118 essentially serves as an oxygen infusion blocking layer to protect the underlying active nanosheet channel layer 116 from being infused with oxygen and oxidized by the RIE process (e.g., directional plasma etch process) which is performed as part of the work function metal patterning process. In the absence of the dummy nanosheet channel layer 118, oxygen would infuse into the active nanosheet channel layer 116, resulting in the growth or the regrowth (increased thickness) of the interfacial silicon oxide layer 150 on the upper surface of the active nanosheet channel layer 116. While the wet etch removal of the first layer of work function metal 160 may slightly increase the thickness of the interfacial silicon oxide layers 150, such increase is essentially insignificant, and is equally applied to the interfacial layers 150 of all the active nanosheet channel layers 112, 114 and 116, thereby maintaining the symmetry in the thickness of the active nanosheet channel layer 112, 114, and 116.

Next, FIGS. 10A and 10B schematically illustrate a plasma etch process 180 (or ash process) that is performed on the semiconductor device structure of FIG. 9 to remove the etch mask 170. During the plasma etch process 180, oxygen atoms within the etch environment can penetrate through the high-k dielectric layer 152 into the silicon surface of the dummy nanosheet channel layer 118 and grow an even thicker interfacial silicon oxide layer 150-1 on the upper surface of the dummy nanosheet channel layer 118. Again, in this instance, the dummy nanosheet channel layer 118 serves as an oxygen infusion blocking layer to protect the underlying active nanosheet channel layer 116 from being infused with oxygen and oxidized by the directional plasma etch process 180, and thereby prevents an increase in the thickness of the interfacial silicon oxide layer 150 on the upper surface of the active nanosheet channel layer 116.

After removing the OPL etch mask 170, a second layer of work function metal 162 is deposited to fill the open gate region 145-2 of the nanosheet FET device D1, and then planarized, resulting in the semiconductor device structure 10 shown in FIGS. 1A and 1B. As noted above, the second layer of work function metal 162 comprises a metallic material that is selected to tune the threshold voltage (Vt) of the second nanosheet FET device. In one embodiment, the second layer of work function metal 162 comprise TiAlC, which is suitable for p-type FET devices. In one embodiment, the second layer of work function metal 162 may comprise multiple layers of metallic material, for example, a thin layer of TiN, a second thin layer of TiAlC, and a third layer of TiN to fill the remainder of the gate region.

As noted above, the resulting semiconductor device structure shown in FIGS. 1A and 2B comprises nanosheet FET devices D1 and D2 with differently tuned threshold voltages and with stacks of active nanosheet channel layers 112, 114, and 116 that have a uniform surrounding environment. In particular, the active nanosheet channel layers 112, 114, and 116 have interfacial layers 150 with same (or substantially the same) thickness, and the same amount of work function metal 160 and 162 in the regions above and below (and on the sides) of the active nanosheet channels 112, 114 and 116, which prevents or minimizes Vt variation of the active nanosheet channels 112, 114 and 116 for the given types of nanosheet FET devices D1 and D2, as well as the Vt variation over same types of nanosheet FET devices within the device regions. Indeed, without the dummy nanosheet channel layers 118, the interfacial layers 150 formed on the upper surfaces of the active nanosheet channel layers 116 would be the depth D of the WFM recess would result in variation in the thickness, or in the removal of the portion of the work function metal 162 above the upper active nanosheet channel layer 116, resulting in undesirable Vt variation, or dysfunction of the upper active nanosheet channel layer 116.

Following the formation of the HKMG structures, an etch process is then performed to recess an upper portion of the work function metal layers 160 and 162 down to a target level below the upper surface of the ILD layer 140. A layer of dielectric material is then deposited over the surface of the semiconductor device structure to fill the area above the recessed surfaces of the work function metal layers 160 and 162 with dielectric material, and the semiconductor device structure is planarized down to the surface of the ILD layer 140 to remove the overburden dielectric material, and thereby form gate capping layers. The gate capping layers can be formed of a dielectric material such as SiN or SiBCN, etc. Thereafter, any known sequence of processing steps can be performed to complete the fabrication of the semiconductor integrated circuit device, the details of which are not needed to understand embodiments of the invention. Briefly, by way of example, middle-of-the-line (MOL) processing can continue to form MOL contacts (e.g., gate contacts, source/drain contacts, etc.). Then, a back-end-of-line (BEOL) process module can be performed to fabricate a BEOL interconnect structure which provides connections to/between the MOL contacts, and other active or passive devices that are formed as part of the front-end-of-line (FEOL) layer.

Figure 11:
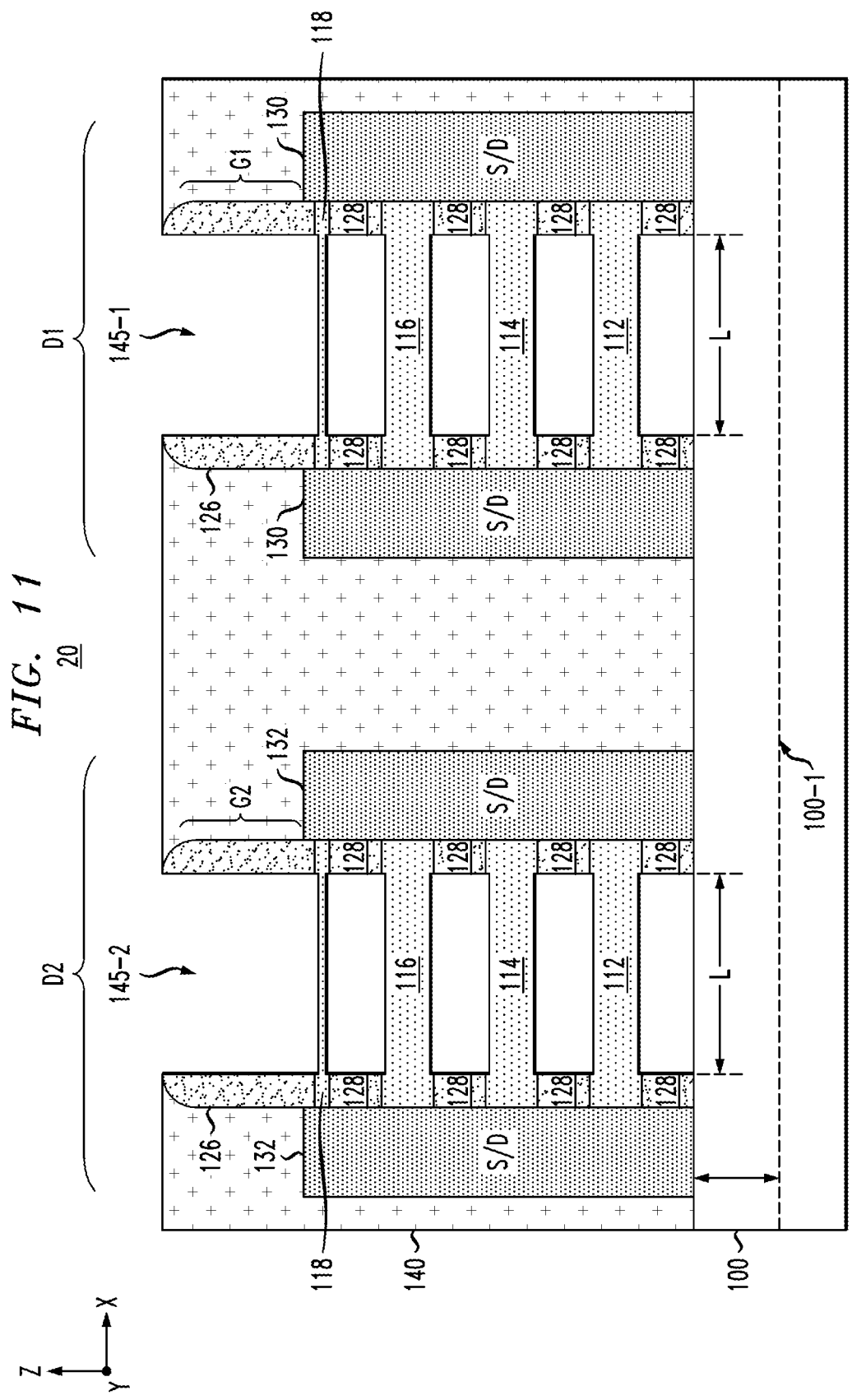
Figure 12:
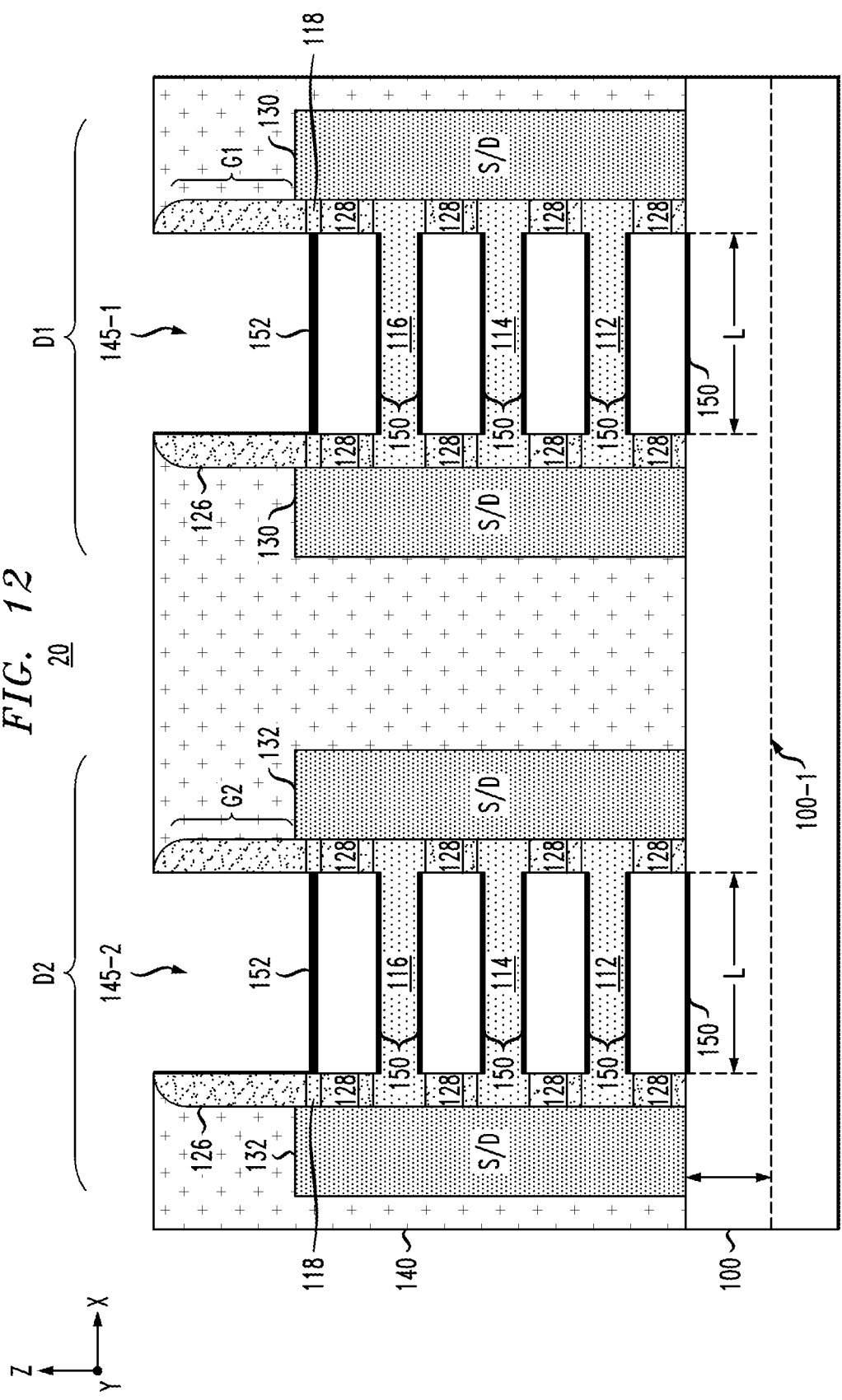
Figure 13:
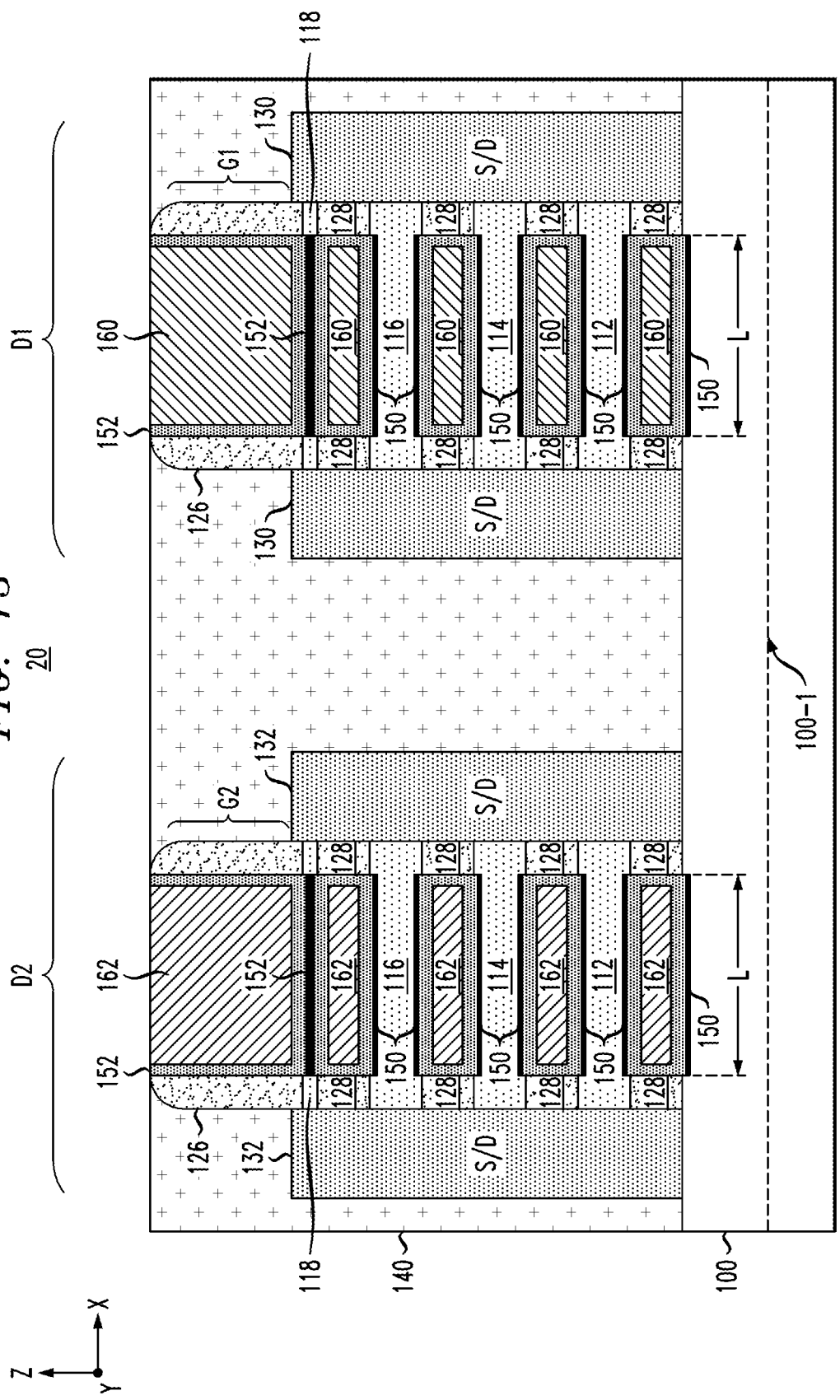

FIGS. 11-13 schematically illustrate a method for fabricating a semiconductor integrated circuit device comprising nanosheet FET devices which have a dummy nanosheet channel layer to protect active nanosheet channel layers from being damaged during work function metal patterning, according to an embodiment of the invention. In particular, the process flow of FIGS. 11-13 provides an alternate embodiment starting with the semiconductor device structure shown in FIGS. 6A, 6B, and 6C wherein prior to forming the interfacial silicon oxide layers 150, FIG. 11 is a schematic cross-sectional side view of the semiconductor structure of FIG. 6B after performing a silicon thinning process to decrease a thickness of the exposed portions of the dummy nanosheet channel layers 118 and the active nanosheet channel layers 112, 114, and 116 within the first and second open gate regions 145-1 and 145-2 of the first and second gate structures G1 and G2. For example, in one embodiment, the thickness of the dummy nanosheet channel layers 118 and the active nanosheet channel layers 112, 114, and 116 is decreased about 1 nm by recessing the upper and bottom surfaces of the exposed active nanosheet channel layers 112, 114, 116, and dummy nanosheet channel layers 118 by about 0.5 nm.

In one embodiment of the invention, the exposed surfaces of the dummy nanosheet channel layers 118 and the active nanosheet channel layers 112, 114, and 116 within the open gate regions 145-1 and 145-2 of the nanosheet FET devices D1 and D2 are etched using a process comprising (i) oxidizing the exposed silicon surfaces to form a thin oxide layer on the exposed silicon surfaces, and (ii) removing (via etching) the thin oxide layers to form the thinned dummy nanosheet channel layers 118 and the active nanosheet channel layers 112, 114, and 116. In one embodiment, the oxidation process is performed using a low-temperature plasma-assisted oxidation process, with an oxygen plasma stream generated using known techniques and other precursors (inert gases) such as nitrogen or argon. The thin oxide layers are removed using known etching chemistries and techniques. In another embodiment, the silicon thinning process can be performed using an in-situ diluted HCl etch process, in which the amount of silicon material etched away is controlled by a timed etch. In another embodiment, the silicon thinning process can be implemented using a wet oxidation process following and wet etch process, using known etching solutions and techniques.

Next, FIG. 12 is a schematic cross-sectional side view of the semiconductor device of FIG. 11 after forming thin interfacial oxide layers 150 on the exposed, thin silicon surfaces of the active nanosheet channel layers 112, 114 and 116 within the open gate regions 145-1 and 145-2 and converting the thinned dummy nanosheet channel layer 118 to a dummy oxide nanosheet layer 152. The process for forming the interfacial oxide layers 150 is the same or similar to the process discussed above in conjunction with FIG. 7, the details of which will not be repeated. However, in the oxidation process of FIG. 12, since the dummy nanosheet channel layer 118 is thinned to have an ultra-thin profile (e.g., reduced thickness of about 1 nm to about 2 nm), the silicon material of the thinned dummy nanosheet channel layer 118 is either entirely consumed or substantially consumed by the oxygen infusion, thereby essentially converting the thinned dummy silicon nanosheet channel layer 118 to a dummy oxide nanosheet layer 152. Even if some pure silicon material exists in the thinned portion of the dummy nanosheet channel layer 118 after the oxidation process to form the interfacial layers 150, the remaining silicon material would be consumed by oxygen infusion during the work function metal patterning process (e.g., OPL RIE and OPL strip), as described above.

Next, FIG. 13 is a schematic cross-sectional side view of the semiconductor device of FIG. 12 after forming high-k gate dielectric and work function metal gate structures within the open gate regions 145-1 and 145-2 of the first and second nanosheet FET devices D1 and D2, using the same or similar process flow and materials as discussed above in conjunction with FIGS. 8A, 8B, 9, 10A and 10B. The resulting semiconductor device structure 20 shown in FIG. 13 is similar to the resulting semiconductor device structure 10 of FIG. 1A except that the nanosheet FET devices D1 and D2 of the semiconductor device structure 20 in FIG. 13 comprise thinned active nanosheet channel layers 112, 114 and 116, and dummy nanosheet oxide layers 152 which are formed by the complete oxidation of the thinned portion of the dummy nanosheet channel layers 118.

It is to be understood that the methods discussed herein for fabricating nanosheet FET devices with protective dummy nanosheet channel layers can be readily incorporated within semiconductor processing flows, semiconductor devices, and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with the present invention can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the invention provided herein, one of ordinary skill in the art will be able to contemplate other implementations and applications of the techniques of the invention.

Although exemplary embodiments have been described herein with reference to the accompanying figures, it is to be understood that the invention is not limited to those precise embodiments, and that various other changes and modifications may be made therein by one skilled in the art without departing from the scope of the appended claims.

What is claimed is:

1. A semiconductor integrated circuit device, comprising:
a nanosheet field-effect transistor device disposed on a semiconductor substrate, wherein the nanosheet field-effect transistor device comprises:
a nanosheet stack structure comprising a plurality of active nanosheet channel layers and a dummy nanosheet layer disposed above the active nanosheet channel layers of the nanosheet stack structure; and
a metal gate structure covering the nanosheet stack structure, wherein the metal gate structure comprises:
a conformal gate dielectric layer disposed on surfaces of each of the dummy nanosheet layer and the active nanosheet channel layers; and
a work function metal layer formed on the conformal gate dielectric layers and filling the gate region including spaces above and below the active nanosheet channel layers and the dummy nanosheet layer with the work function metal layer;
wherein each of the active nanosheet channel layers has a first thickness, and wherein the dummy nanosheet layer has a second thickness which is less than the first thickness of each of the active nanosheet channel layers, wherein the second thickness of the dummy nanosheet layer is configured so that the dummy nanosheet layer does not function as an active channel layer of the nanosheet field-effect transistor device; and
wherein the dummy nanosheet layer serves as an oxygen infusion blocking layer to protect the active nanosheet channel layers from being infused with oxygen and oxidized by a directional plasma etch process performed during a work function metal patterning process to remove a previous layer of work function metal disposed in the gate region.

2. The semiconductor integrated circuit device of claim 1, wherein at least a portion of the dummy nanosheet layer comprises an oxide layer formed by oxidation of the dummy nanosheet layer as a result of the directional plasma etch process.

3. The semiconductor integrated circuit device of claim 1, wherein the dummy nanosheet layer comprises epitaxial silicon material and has thickness of about 2 nm to about 4 nm.

4. The semiconductor integrated circuit device of claim 1, wherein each active nanosheet channel layer comprises epitaxial silicon with a thickness of about 6 nm to about 8 nm.

5. The semiconductor integrated circuit device of claim 1, wherein the conformal gate dielectric layers each comprise a high-k dielectric material having a dielectric constant greater than about 3.9.

6. The semiconductor integrated circuit device of claim 5, wherein the conformal gate dielectric layers each comprise an interfacial silicon oxide layer disposed between the high-k gate dielectric material and silicon material of the active nanosheet channel layer and the dummy nanosheet layer.

7. The semiconductor integrated circuit of claim 1, wherein the work function metal layer comprises one of titanium nitride and titanium aluminum carbide.

8. A semiconductor integrated circuit device, comprising:
a nanosheet field-effect transistor device disposed on a semiconductor substrate, wherein the nanosheet field-effect transistor device comprises:
a nanosheet stack structure comprising a plurality of active nanosheet channel layers and a dummy nanosheet layer disposed above the active nanosheet channel layers of the nanosheet stack structure; and
a metal gate structure covering the nanosheet stack structure, wherein the metal gate structure comprises:
a conformal gate dielectric layer disposed on surfaces of each of the dummy nanosheet layer and the active nanosheet channel layers; and
a work function metal layer formed on the conformal gate dielectric layers and filling the gate region including spaces above and below the active nanosheet channel layers and the dummy nanosheet layer with the work function metal layer;
wherein each of the active nanosheet channel layers has a first thickness, and wherein the dummy nanosheet layer has a second thickness which is less than the first thickness of each of the active nanosheet channel layers, wherein the second thickness of the dummy nanosheet layer is configured so that the dummy nanosheet layer does not function as an active channel layer of the nanosheet field-effect transistor device.

9. The semiconductor integrated circuit device of claim 8, wherein at least a portion of the dummy nanosheet layer comprises an oxide layer formed by oxidation of the dummy nanosheet layer.

10. The semiconductor integrated circuit device of claim 8, wherein the dummy nanosheet layer comprises epitaxial silicon material and has thickness of about 2 nm to about 4 nm.

11. The semiconductor integrated circuit device of claim 8, wherein each active nanosheet channel layer comprises epitaxial silicon with a thickness of about 6 nm to about 8 nm.

12. The semiconductor integrated circuit device of claim 8, wherein the conformal gate dielectric layers each comprise a high-k dielectric material having a dielectric constant greater than about 3.9.

13. The semiconductor integrated circuit device of claim 12, wherein the conformal gate dielectric layers each comprise an interfacial silicon oxide layer disposed between the high-k gate dielectric material and silicon material of the active nanosheet channel layer and the dummy nanosheet layer.

14. The semiconductor integrated circuit of claim 8, wherein the work function metal layer comprises one of titanium nitride and titanium aluminum carbide.

15. A semiconductor integrated circuit device, comprising:
a first nanosheet field-effect transistor device and a second nanosheet field-effect transistor device disposed on a semiconductor substrate;
wherein the first nanosheet field-effect transistor device comprises:
a first nanosheet stack structure comprising a plurality of active nanosheet channel layers and a dummy nanosheet layer disposed above the active nanosheet channel layers of the first nanosheet stack structure; and a first metal gate structure covering the first nanosheet stack structure, wherein the first metal gate structure comprises:
  a first conformal gate dielectric layer disposed on surfaces of each of the dummy nanosheet layer and the active nanosheet channel layers; and
  a first work function metal layer disposed on the first conformal gate dielectric layers and filling the gate region including spaces above and below the active nanosheet channel layers and the dummy nanosheet layer of the first nanosheet stack structure with the first work function metal layer;
wherein each of the active nanosheet channel layers of the first nanosheet stack structure has a first thickness, and wherein the dummy nanosheet layer of the first nanosheet stack structure has a second thickness which is less than the first thickness of each of the active nanosheet channel layers of the first nanosheet stack structure, wherein the second thickness of the dummy nanosheet layer is configured so that the dummy nanosheet layer does not function as an active channel layer of the first nanosheet field-effect transistor device; and
wherein the second nanosheet field-effect transistor device comprises:
  a second nanosheet stack structure comprising a plurality of active nanosheet channel layers and a dummy nanosheet layer disposed above the active nanosheet channel layers of the second nanosheet stack structure; and
  a second metal gate structure covering the second nanosheet stack structure, wherein the metal gate structure comprises:
    a second conformal gate dielectric layer disposed on surfaces of each of the dummy nanosheet layer and the active nanosheet channel layers; and
    a second work function metal layer disposed on the second conformal gate dielectric layers and filling the gate region including spaces above and below the active nanosheet channel layers and the dummy nanosheet layer of the second nanosheet stack structure with the second work function metal layer;
  wherein each of the active nanosheet channel layers of the second nanosheet stack structure has a third thickness, and wherein the dummy nanosheet layer of the second nanosheet stack structure has a fourth thickness which is less than the third thickness of each of the active nanosheet channel layers of the second nanosheet stack structure, wherein the fourth thickness of the dummy nanosheet layer is configured so that the dummy nanosheet layer does not function as an active channel layer of the second nanosheet field-effect transistor device.

16. The semiconductor integrated circuit device of claim 15, wherein at least a portion of each dummy nanosheet layer of the first and second nanosheet stack structures comprises an oxide layer formed by oxidation of the dummy nanosheet layers.

17. The semiconductor integrated circuit device of claim 15, wherein the dummy nanosheet layers of the first and second nanosheet stack structures comprise epitaxial silicon material, wherein the second thickness and the fourth thickness are the same, and wherein the second thickness and the fourth thickness are in a range of about 2 nm to about 4 nm.

18. The semiconductor integrated circuit device of claim 15, wherein each active nanosheet channel layer of the first and second nanosheet stack structures comprises epitaxial silicon, wherein the first thickness and the third thickness are the same, and wherein the first thickness and the third thickness are in a range of about 6 nm to about 8 nm.

19. The semiconductor integrated circuit device of claim 15, wherein the first and second conformal gate dielectric layers each comprise:
  a high-k dielectric material having a dielectric constant greater than about 3.9; and
  an interfacial silicon oxide layer disposed between the high-k gate dielectric material and silicon material of the active nanosheet channel layers and the dummy nanosheet layer.

20. The semiconductor integrated circuit of claim 15, wherein the first work function metal layer comprises a first work function metal, wherein the second work function metal layer comprises a second work function metal, which is different from the first work function metal.

* * * * *